United States Patent [19]

Shibata et al.

[11] Patent Number: 5,543,252
[45] Date of Patent: Aug. 6, 1996

[54] METHOD FOR MANUFACTURING EXPOSURE MASK AND THE EXPOSURE MASK

[75] Inventors: Tsuyoshi Shibata; Koji Hashimoto; Katsuhiko Heida, all of Kanagawa-ken; Kenji Kawano, Tokyo; Shinichi Ito; Keiji Horioka, both of Kanagawa-ken, all of Japan

[73] Assignee: Kabushiki Kaisha Toshiba, Kawasaki, Japan

[21] Appl. No.: 228,504

[22] Filed: Apr. 15, 1994

Related U.S. Application Data

[63] Continuation-in-part of Ser. No. 853,436, Mar. 18, 1992, Pat. No. 5,468,576.

[30] Foreign Application Priority Data

Mar. 29, 1991 [JP] Japan ................ 3-067268

[51] Int. Cl.$^6$ ............................... G03F 9/00
[52] U.S. Cl. ............... 430/5; 430/312; 430/313; 430/314
[58] Field of Search .................. 430/5, 312, 313, 430/314

[56] References Cited

U.S. PATENT DOCUMENTS 5,114,760  5/1992  Takemura et al. ............ 428/409
5,153,083  10/1992  Garofalo et al. ............ 430/5

FOREIGN PATENT DOCUMENTS 1025986  1/1989  Japan .
4-275124  7/1994  Japan .

*Primary Examiner*—S. Rosasco
*Attorney, Agent, or Firm*—Oblon, Spivak, McClelland, Maier, & Neustadt, P.C.

[57] ABSTRACT

A method for manufacturing an exposure mask provided with a substrate for transmitting an exposure light and with phase shifters arranged at prescribed intervals on the substrate for shifting the phase of the exposure light transmitted through the substrate by a half wavelength as compared with the phase of the exposure light transmitted through both the substrate and an opening between the phase shifters consists of the steps of preparing a solution containing a phase shifter material, arranging resist layers at the prescribed intervals on the substrate, immersing the substrate with the resist layers in the solution, forming the phase shifters on the substrate between the resist layers by a prescribed thickness by depositing the material of the phase shifter from the solution, and removing the resist layers from the substrate to form the openings.

55 Claims, 24 Drawing Sheets

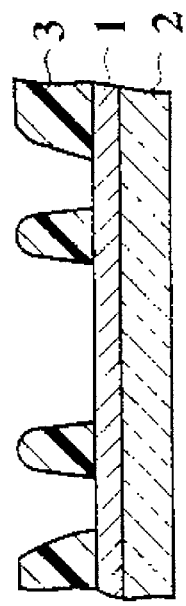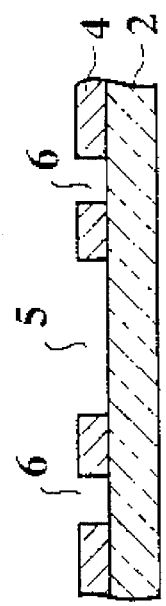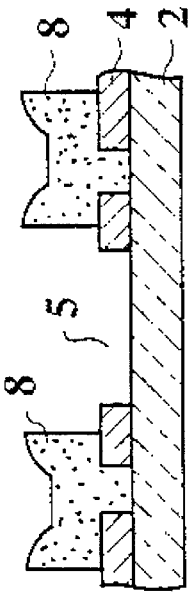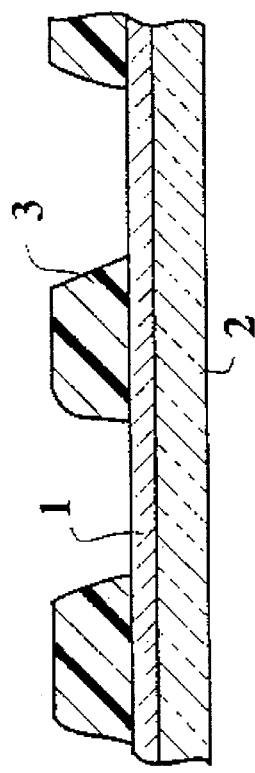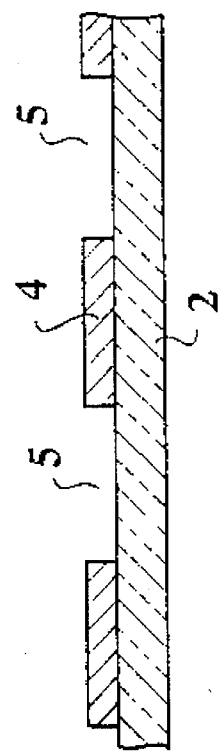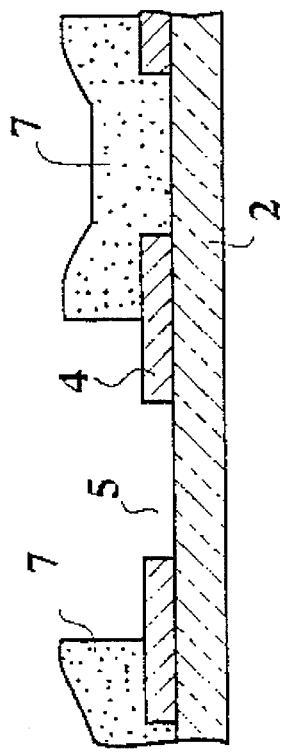

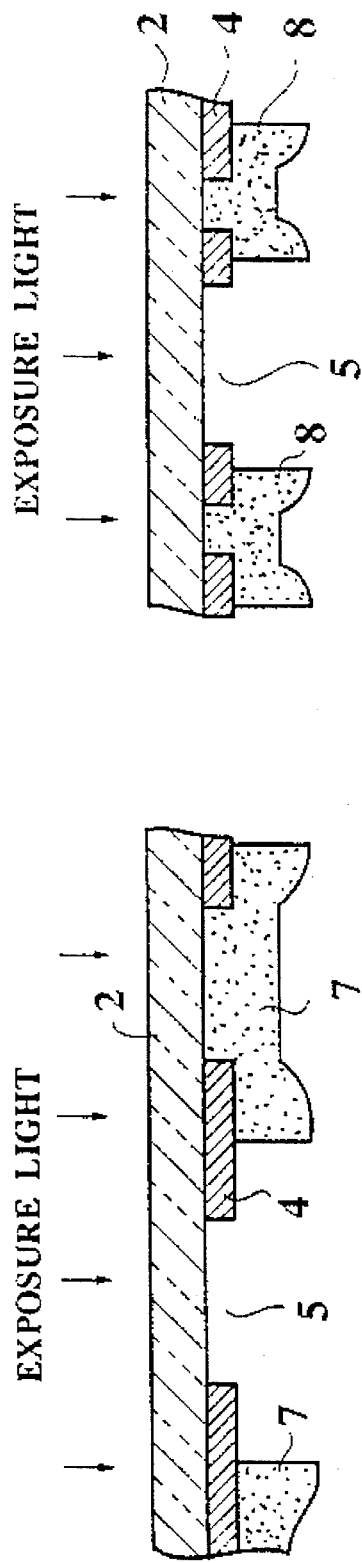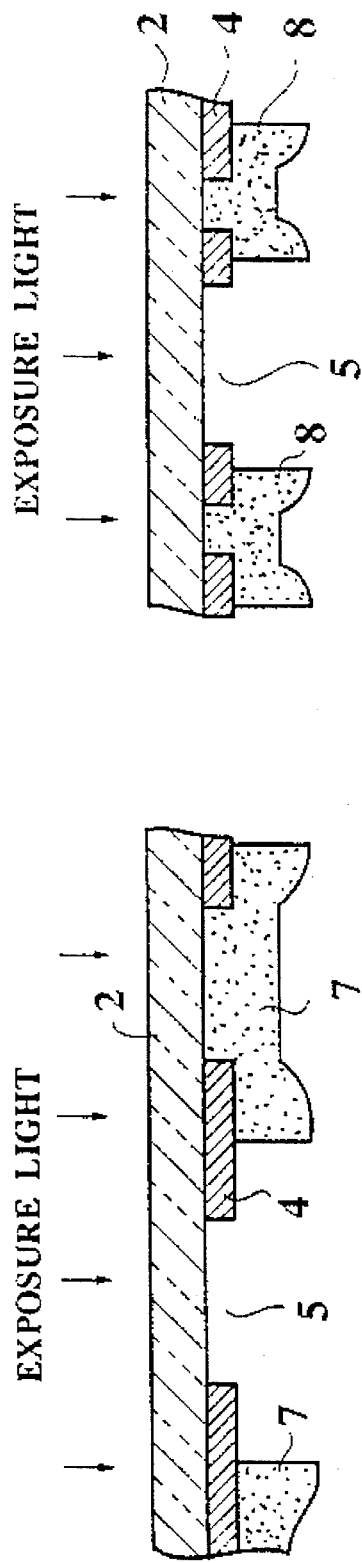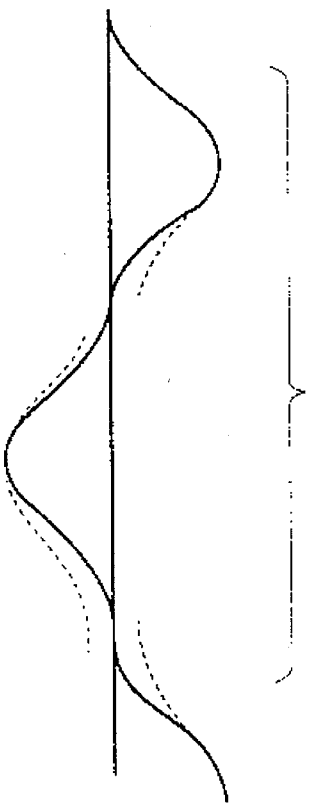

FIG.3A
LEVENSON TYPE OF EXPOSURE MASK
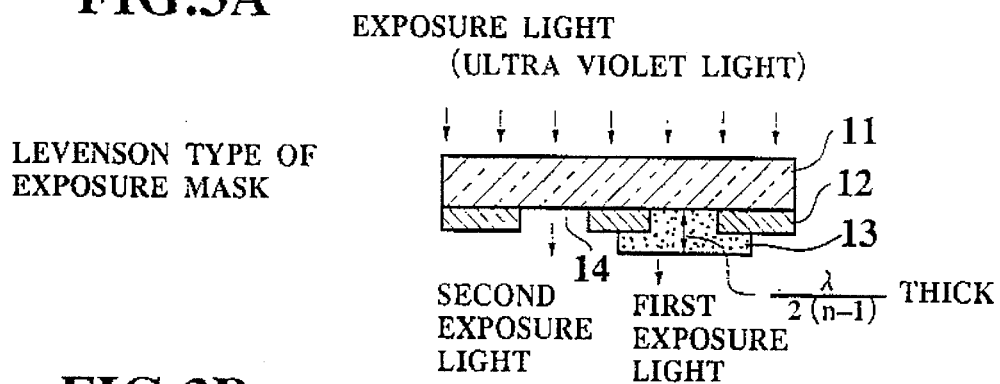
FIG.3B
AMPLITUDE DISTRIBUTION OF EXPOSURE LIGHT TRANSMITTED THROUGH EXPOSURE MASK IN CASES WHERE DIFFRACTION IS NOT CONSIDERED
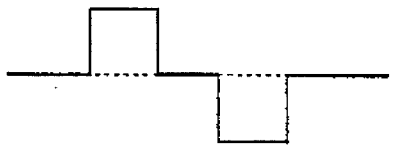
FIG.3C
AMPLITUDE DISTRIBUTION OF DIFFRECTED EXPOSURE LIGHT TRANSMITTED THROUGH EXPOSURE MASK
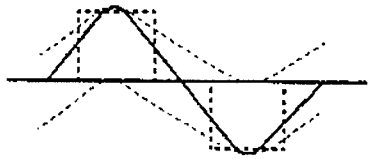
FIG.3D
INTENSITY DISTRIBUTION OF EXPOSURE LIGHT OPTICALLY DIFFRACTED AND INTERFERED
FIG.3E
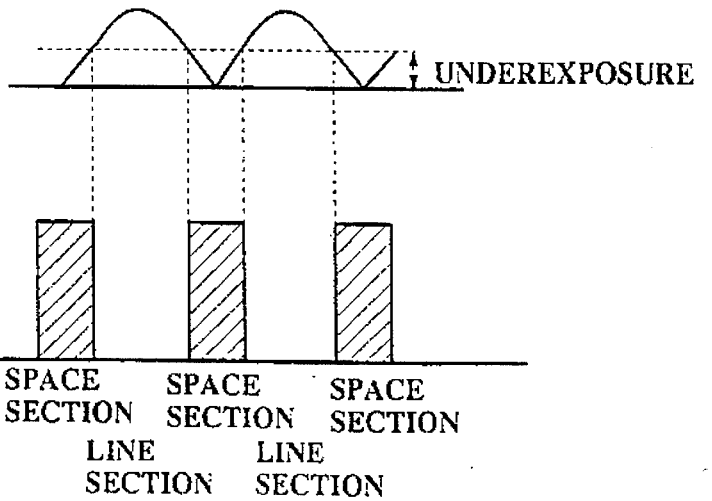

FIG.4A

SELF-ALIGNED TYPE OF EXPOSURE MASK

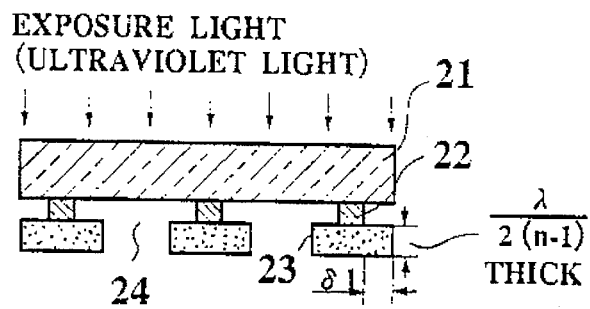

$\delta 1$ : OVERHANGED WIDTH

FIG.4B

AMPLITUDE DISTRIBUTION OF EXPOSURE LIGHT TRANSMITTED THROUGH EXPOSURE MASK IN CASES WHERE DIFFRACTION IS NOT CONSIDERED

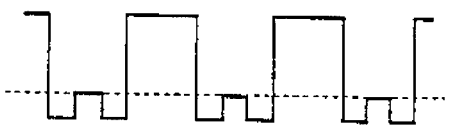

FIG.4C

AMPLITUDE DISTRIBUTION OF DIFFRACTED EXPOSURE LIGHT TRANSMITTED THROUGH EXPOSURE MASK

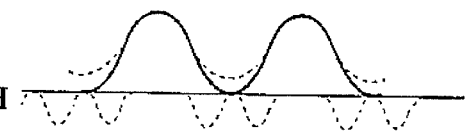

FIG.4D

INTENSITY DISTRIBUTION OF EXPOSURE LIGHT OPTICALLY DIFFRACTED AND INTERFERED

FIG.4E

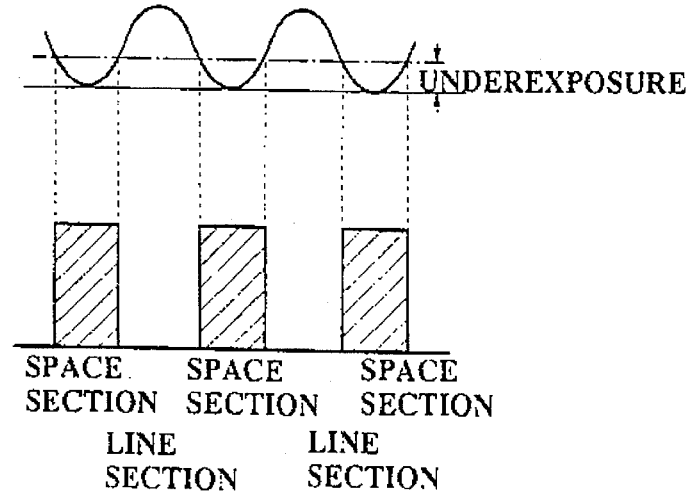

FIG.5A

SHIFT EDGE TYPE OF EXPOSURE MASK

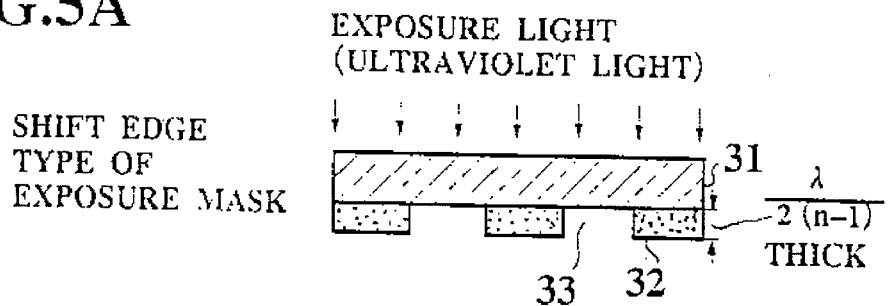

EXPOSURE LIGHT (ULTRAVIOLET LIGHT)

$\dfrac{\lambda}{2(n-1)}$ THICK

FIG.5B

AMPLITUDE DISTRIBUTION OF EXPOSURE LIGHT TRANSMITTED THROUGH EXPOSURE MASK IN CASES WHERE DIFFRACTION IS NOT CONSIDERED

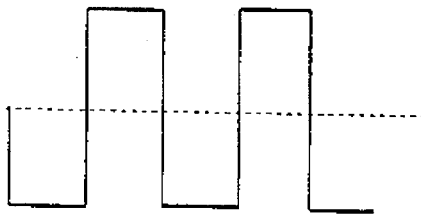

FIG.5C

AMPLITUDE DISTRIBUTION OF DIFFRACTED EXPOSURE LIGHT TRANSMITTED THROUGH EXPOSURE MASK

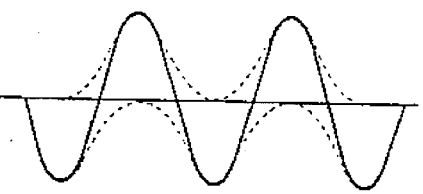

FIG.5D

INTENSITY DISTRIBUTION OF EXPOSURE LIGHT OPTICALLY DIFFRACTED AND INTERFERED

FIG.5E

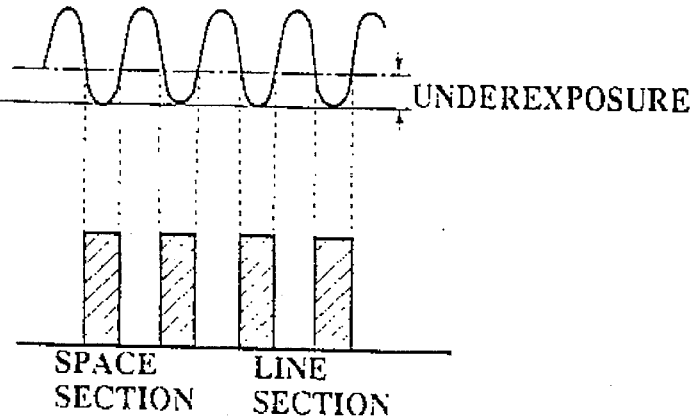

UNDEREXPOSURE

SPACE SECTION    LINE SECTION

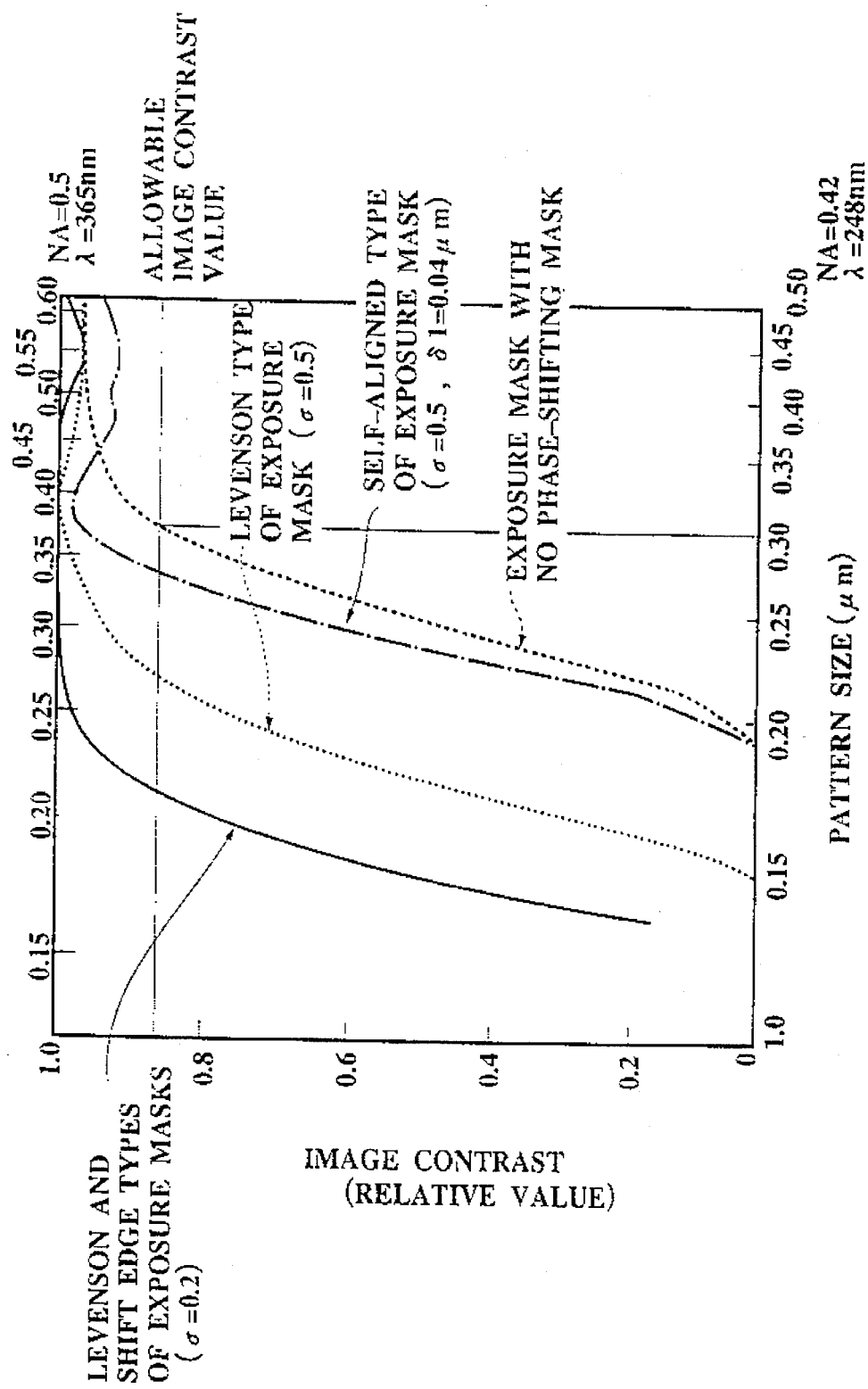

PRESENT INVENTION

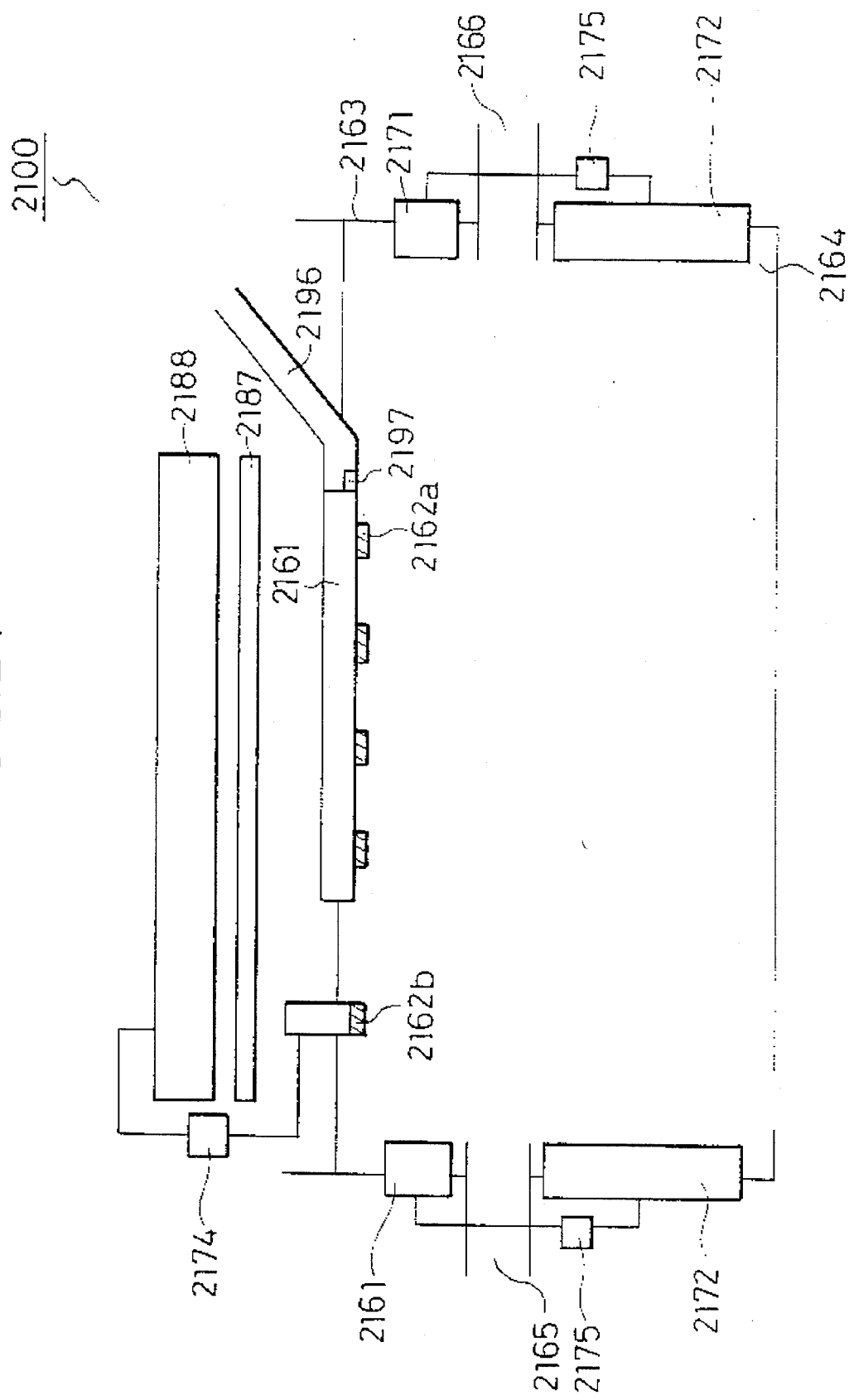

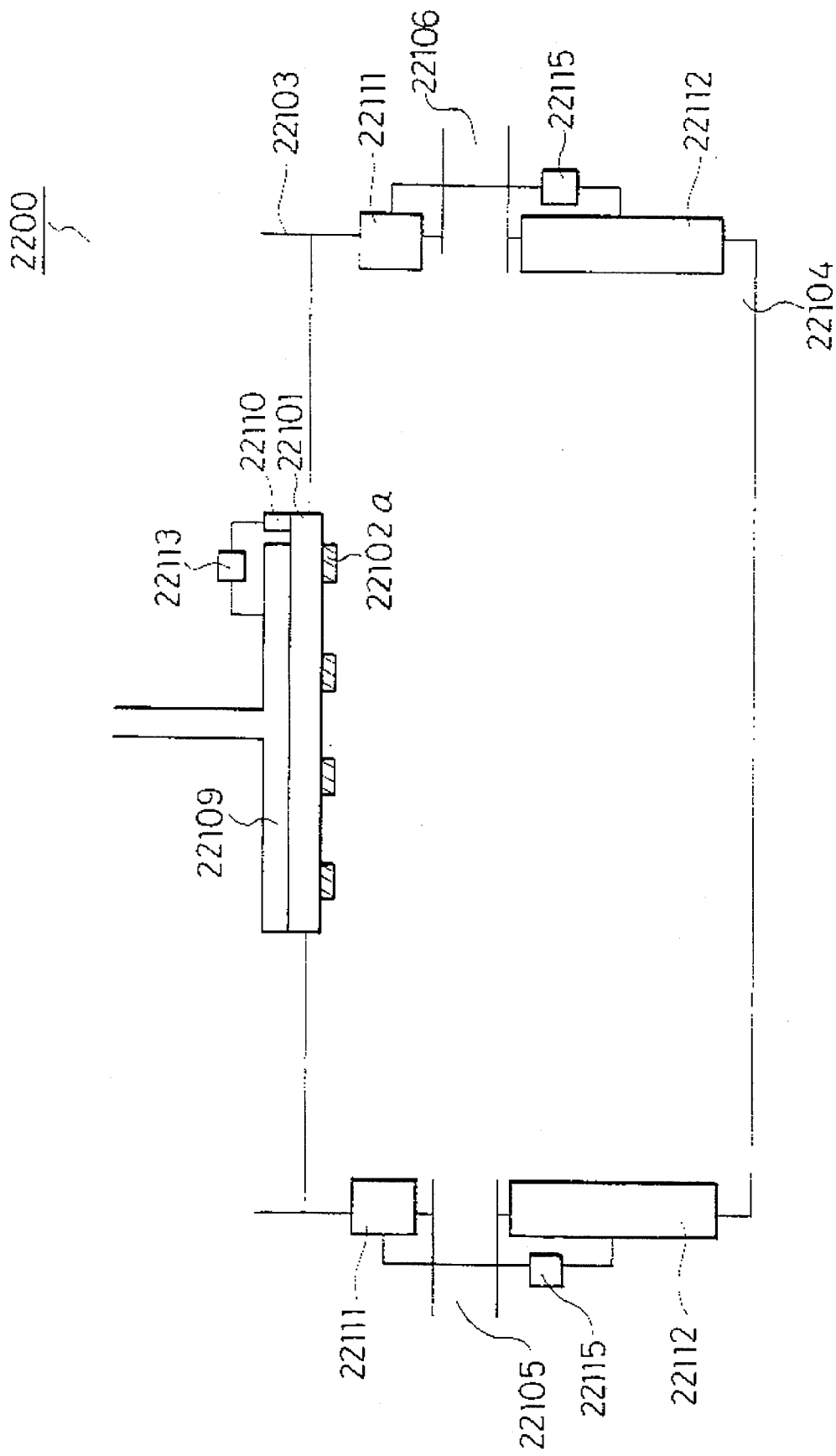

METHOD FOR MANUFACTURING EXPOSURE MASK AND THE EXPOSURE MASK

RELATED APPLICATIONS

This is a continuation-in-part application of U.S. Ser. No. 07/853,436 filed on Mar. 18, 1992, U.S. Pat. No. 5,468,576.

BACKGROUND OF THE INVENTION

1. Field of the Invention

The present invention relates to a method for manufacturing an exposure mask which is utilized in the manufacture of semiconductor integrated circuits and the like, and, in particular to a method for manufacturing an exposure mask which is provided with a phase-shifting mask by which the phase of the light is shifted.

2. Description of Background

In recent years, semiconductor circuits have become integrated on a large scale, so that a lithography technique is important in the manufacture of large-scale semiconductor integrated circuits.

Nowadays, light sources such as g-rays, i-rays, excimer lasers, and X-rays have been adopted in manufacturing large-scale semiconductor integrated circuits by utilizing the lithography technique. Also, new resist materials which are chemically changed by exposed light generated by the light source have been developed to utilize the light source. Moreover, resist processing techniques such as a multi-layer resist method, a contrast enhanced lithography (CEL) method, and an image reverse method have been developed.

On the other hand, when the large-scale semiconductor integrated circuits are manufactured, an exposure mask is required to shield certain fields specified in the resist. That is, a striped pattern which is formed by alternately arranging dark and bright light regions is made by the light transmitted through the exposure mask. In detail, the specific fields in the resist aligned with the dark light region are not exposed by the light transmitted through the exposure mask so that the specific fields in the resist are selectively removed or remain after a prescribed removal process is implemented.

Therefore, the light intensity of the boundary between the bright and dark light regions must be considerably lowered to clarify the boundary, so that the resolution of the transmitted light can be improved.

Recently, a conventional method for manufacturing a exposure mask with a phase-shifting mask by utilizing a phase-shifting method has been proposed to improve the resolution of the transmitted light (lectured papers 8, page 497, lecture No. 4a-K-7 in the Applied Physics Society of Japan, autumn, 1988).

The phase-shifting method is described with reference to FIGS. 1A to 1F and 2 as follows.

FIGS. 1A, 1C, and 1E are cross sectional views showing a conventional method for manufacturing a conventional exposure mask which is utilized to make line sections and space sections on an exposed semiconductor device.

FIGS. 1B, 1D, and 1F are cross sectional views showing another conventional method for manufacturing another conventional exposure mask which is utilized to make an isolated space section on an exposed semiconductor device.

As shown in FIGS. 1A, 1B, a shading layer 1 made of chromium (Cr) or chromium oxide ($Cr_2O_3$) is deposited to a thickness of about 1000 angstroms (Å) on a quartz substrate 2 by a sputtering method. The exposure light cannot pass through the shading layer 1, but can pass through the quartz substrate 2 without a substantial decrease in intensity.

Thereafter, a resist layer 3 for protecting the shading layer 1 from being etched is coated and patterned on the shading layer 1 by an electron beam unit. Thereafter, as shown in FIGS. 1C, 1D, the shading layer 1 not covered by the resist layer 3 is etched by a wet etching method or a reactive ion etching method, and the shading layer 1 covered by the resist layer 3 is protected from the etching process. Therefore, the shading layer 1 not etched by the etching method is patterned to form a patterned shading layer 4 before the patterned resist layers 3 are removed. Openings 5 between the patterned shading layers 4 are wider than a pair of auxiliary openings 6 between the patterned shading layers 4.

Thereafter, as shown in FIG. 1E, the openings 5 are alternately deposited by a plurality of phase shifters 7 using a chemical vapor depositing (CVD) method. Moreover, as shown in FIG. 1F, each auxiliary opening 6 is covered by a phase shifter 8 by the CVD method, while the opening 5 is not deposited by a phase shifter. The height of the phase shifters 7, 8 is a prescribed value $H=\lambda/2(n-1)$. Here, the symbol $\lambda$ indicates a wavelength of an exposure light transmitted from the quartz substrate 2 to the phase shifter 7 (8) or the opening 5, and the symbol n indicates the refractive index of the phase shifters 7, 8. Therefore, the phase of the exposure light transmitted through the quartz substrate 2 and the phase shifter 7, or 8 is shifted by a half wavelength $\lambda/2$ as compared with the exposure light transmitted the opening 5 through the quartz substrate 2.

FIGS. 2A, 2B are cross sectional views of the conventional exposure masks manufactured by the method shown in FIGS. 1A to 1F. FIGS. 2C, 2D show the amplitude of the exposure light transmitted from the quartz substrate 2 to the phase shifter 7 (8) or the opening 5.

As shown in FIGS. 2A, 2B, the phase of the exposure light transmitted through the phase shifter 7 (8) is shifted by a half wavelength as compared with the exposure light transmitted through the opening 5. Moreover, the exposure light transmitted through the phase shifter 7 (8) or the opening 5 is optically diffracted by the patterned shading layers 4, so that the various exposure lights transmitted through the exposure mask optically interfere with one another.

Therefore, as shown in FIG. 2C, 2D, the diffracted lights of which the amplitudes are shown by broken lines are superimposed on one another so that an interfered light of which the amplitude is shown by a solid line is formed. That is, the intensity of the exposure light is considerably decreased in optical paths specified between the phase-shifted light transmitted through the phase shifter 7 (8) and the exposure light transmitted through the opening 5.

Accordingly, because the light intensity is considerably decreased in the specific optical paths, the difference between dark and bright light regions alternately arranged by the light transmitted through the exposure mask can be clearly distinguished.

For example, in the case of the conventional exposure mask which is utilized to make line sections and space sections on a negative type of resist layer of an exposed semiconductor device, as shown in FIGS. 2A, 2C, the line sections are made in positions aligned with the opening 5 or the phase shifter 7 by exposure to the bright light transmitted through the exposure mask. Moreover, the space sections are made in positions aligned with the shading layer 1 by exposure to the dark light transmitted through the exposure mask.

On the other hand, in the case of a conventional exposure mask which is utilized to make an isolated space section on a positive type of resist layer of an exposed semiconductor device, as shown in FIGS. 2B, 2D, the intensity of the exposure light transmitted through the phase shifter 8 is, as is well known, considerably smaller than that of the exposure light transmitted through the opening 5 because the width of the auxiliary opening 6 is narrower than the width of the opening 5. Therefore, the shifted exposure light transmitted through the phase shifter 8 is considerably decreased after the shifted light is subjected to optical interference from the exposure light transmitted through the opening 5. As a result, the resist layer on the exposed semiconductor device is not exposed by the shifted exposure light because of insufficient light. That is, an isolated space section is made on the resist layer aligned with the opening 5 by exposing the bright light transmitted through the exposure mask, while the resist layer aligned with the phase shifters 8 is not exposed.

However, many drawbacks are generated in the above the exposure mask and the above method for manufacturing the exposure mask.

A first drawback of the method is as follows.

The phase shifters 7 must be alternately arranged in the openings 5 between the patterned shading layers 4 in cases where the line sections and the space sections are formed on the semiconductor device. Therefore, a manufacturing method includes at least a first pattern forming step for forming the patterned shading layers 4, a second pattern forming step for alternately forming the phase shifters 7, and an alignment step for aligning the phase shifters 7 with the patterned shading layers 4. Usually, an alignment function is not provided in the electron beam exposure unit for patterning the shading layer, so that an electron beam exposure unit provided with this alignment function must be developed.

Therefore, it is difficult to implement the above conventional manufacturing method because a large scale unit is required and the cost is very high.

A second drawback of the method is as follows.

A large amount of mask pattern data and lithography data for alternately arranging the phase shifters is required. Therefore, a large amount of complicated data processing is required to manufacture the above exposure mask.

A third drawback of the method is as follows.

The auxiliary openings 6 must be smaller than the opening 5 to decrease the light intensity. Therefore, in cases where the isolated space section must be the minimum size, the auxiliary openings 6 must be smaller than the minimum size.

A first drawback of the exposure mask is as follows.

Because the phase shifters 7,8 are made by the CVD method, the refractive index of the shifters 7, 8 is not exactly the same as that of the substrate 2 regardless of whether the material of the shifters 7, 8 is the same as that of the substrate 2. Therefore, a multi-reflection is generated between the substrate 2 and the phase shifter 7 (8) so that the intensity of the exposure light transmitted through the phase shifter 7 (8) is smaller than that of the exposure light transmitted through the opening 5 in cases where the line and space sections are formed on the semiconductor device. As a result, the intensity of the dark light passing through the specific paths aligned with the shading layers 4 is not fully decreased.

A second drawback of the exposure mask is as follows.

When the exposure mask is washed by an acid processing solution, the phase shifters 7, 8 are eroded away by the solution because the shifters 7, 8 are not very dense.

Next, three types of conventional exposure mask with a phase-shifting mask, such as a Levenson type, a self-aligned type, and a shift edge type are described.

FIG. 3A is a cross sectional view of a Levenson type of exposure mask with a phase-shifting mask. FIG. 3B shows the amplitude distribution of an exposure light transmitted through the mask shown in FIG. 3A in cases where the light is regarded to be not optically diffracted. FIG. 3C shows the amplitude distribution of an exposure light after the light is optically diffracted by the shading layers shown in FIG. 3A. FIG. 3D shows the intensity distribution of the exposure light of which the amplitude is shown by a solid line in FIG. 3C. FIG. 3E shows space and line sections made on a semiconductor device after the device is exposed by the exposure light transmitted through the exposure mask shown in FIG. 3A.

The Levenson type of exposure mask with a phase-shifting mask shown in FIG. 3A comprises a quartz substrate 11 for transmitting an exposure light, shading layers 12 arranged on the quartz substrate 11 at regular intervals for shading the exposure light transmitted through the substrate 11, phase shifters 13 alternately arranged between the shading layers 12 for shifting the phase of the exposure light transmitted through the substrate 11 by a half wavelength as compared with the phase of the light transmitted through openings 14 alternately arranged between the shading layers 12.

A first exposure light transmitted through both the substrate 11 and the opening 14 is diffracted by the shading layers 12. Therefore, the rectangular amplitude distribution of the first exposure light shown in FIG. 3B is changed to the waveform distribution shown by the upper broken line in FIG. 3C.

On the other hand, the phase of a second exposure light transmitted through both the substrate 11 and the phase shifter 13 is shifted by a half wavelength as compared with the first exposure light transmitted through the opening 14. Simultaneously, the shifted second exposure light is diffracted by the shading layers 12. Therefore, the rectangular amplitude distribution of the second exposure light shown in FIG. 3B is changed to the waveform distribution as shown by the lower broken line in FIG. 3C.

Therefore, these exposure lights are subjected to optical interference with one another so that the amplitude of the interfered light is changed to a superposed pattern shown by the solid line in FIG. 3D.

Accordingly, the light intensity is considerably decreased in an optical path aligned with the shading 35 layers 12 so that the space and line sections can be formed on the semiconductor as shown in FIG. 3E.

The Levenson type of exposure mask is easily manufactured and is utilized to manufacture a semiconductor device provided with line sections and space sections because the phase shifters 13 are alternately arranged between the shading layers 12. Therefore, the exposure mask is not appropriate for manufacturing a semiconductor device provided with the isolated space section.

FIG. 4A is a cross sectional view of a self-aligned type of exposure mask with a phase-shifting mask. FIG. 4B shows the amplitude distribution of an exposure light transmitted through the mask shown in FIG. 4A in cases where the light is regarded to be not optically diffracted. FIG. 4C shows an amplitude distribution of an exposure light after the light is optically diffracted by phase shifters shown in FIG. 4A. FIG. 4D shows an intensity distribution of the exposure light of which the amplitude is shown in FIG. 4C. FIG. 4E shows space and line sections made on a semiconductor device after the device is exposed by the exposure light transmitted through the exposure mask shown in FIG. 4A.

A self-aligned type of exposure mask with a phase-shifting mask shown in FIG. 4A comprises a quartz substrate 21 for transmitting an exposure light, shading layers 22 arranged on the quartz substrate 21 at regular intervals for shading the exposure light transmitted through the substrate 21, phase shifters 23 arranged and overhung by a regular width δ1 on the shading layers 22 for shifting the phase of the exposure light transmitted through the substrate 21 by a half wavelength of the light as compared with the phase of the light transmitted through openings 24 between the overhanging parts of the phase shifters 23.

A first exposure light transmitted through both the substrate 21 and the opening 24 is diffracted by the overhanging parts of the phase shifters 23. Therefore, the rectangular amplitude distribution of the light shown in FIG. 4B is changed to the wave form distribution shown by the upper broken line in FIG. 4C.

On the other hand, the phase of a second exposure light transmitted through both the substrate 21 and the overhanging part of the phase shifter 23 is shifted by a half wavelength as compared with the first exposure light transmitted through the opening 24. Simultaneously, the shifted second exposure light is diffracted by the phase shifter 23. Therefore, the rectangular amplitude distribution of the second exposure light shown in FIG. 4B is changed to a waveform distribution shown by the lower broken line in FIG. 3C. In this case, because the overhanging part of the phase shifter 23 transmitting the second exposure light is a narrow width δ1 such as 0.04 μm, the intensity of the second exposure light is, as is well known, decreased.

Therefore, when these exposure lights are subjected to optical interference with one another in an optical path aligned with the overhanging part of the phase shifter 23, the intensity of the interfered light superimposed on these lights in the optical path is considerably decreased as shown by the solid line in FIG. 4C so that the amplitude of the interfered light is changed to the superimposed pattern shown by the solid line in FIG. 4D.

Accordingly, the light intensity is considerably decreased in an optical path aligned with the phase shifters 23 so that the space and line sections or the isolated space section can be formed on the semiconductor as shown in FIG. 4E.

The self-aligned type of exposure mask is appropriate for manufacturing a semiconductor device provided with the line and space sections or the isolated space section because the phase shifters 23 are arranged on all the shading layers 22, and the interval between the phase shifters 23 can be arbitrarily set.

Therefore, the exposure mask can be utilized in manufacturing any type of semiconductor circuit.

However, the manufacturing steps are complicated because the phase shifters 23 must overhang by the regular width δ1 on the shading layers 22.

FIG. 5A is a cross sectional view of a shift edge type of exposure mask with a phase-shifting mask. FIG. 5B shows the amplitude distribution of an exposure light transmitted through the mask shown in FIG. 5A in cases where the light is regarded to be not optically diffracted. FIG. 5C shows the amplitude distribution of an exposure light after the light is optically diffracted by the phase shifter as shown in FIG. 5A. FIG. 5D shows the intensity distribution of the exposure light for which the amplitude is shown in FIG. 5C. FIG. 5E shows space and line sections made on a semiconductor device after the device is exposed by the exposure light transmitted through the exposure mask shown in FIG. 5A.

A shift edge type of exposure mask with a phase-shifting mask shown in FIG. 5A comprises a quartz substrate 31 for transmitting an exposure light, phase shifters 32 arranged at regular intervals on the quartz substrate 31 for shifting the phase of the exposure light transmitted through the substrate 31 by a half wavelength as compared with the phase of the light transmitted through the openings 33 between the phase shifters 32.

A first exposure light transmitted through both the substrate 31 and the opening 33 is diffracted by the phase shifters 32. Therefore, the rectangular amplitude distribution of the light shown in FIG. 5B is changed to the waveform distribution shown by the upper broken line in FIG. 5C.

On the other hand, the phase of a second exposure, light transmitted through both the substrate 31 and the phase shifter 32 is shifted by a half wavelength as compared with the first exposure light transmitted through the opening 33. Simultaneously, the shifted second exposure light is diffracted by the phase shifter 32. Therefore, the rectangular amplitude distribution of the second exposure light shown in FIG. 5B is changed to the waveform distribution shown by the lower broken line in FIG. 5C.

Therefore, when these exposure lights are subjected to optical interference with one another in an optical path aligned with a narrow boundary region between the phase shifter 32 and the opening 33, the intensity of the interfered light superimposed on these lights in the optical path is considerably decreased as shown by the solid line in FIG. 5C so that the amplitude of the interfered light is changed to the superimposed pattern shown by the solid line in FIG. 5D.

Accordingly, a resist layer on a semiconductor device aligned with the narrow boundary is underexposed, so that narrow space sections can be formed on the semiconductor device as shown in FIG. 5E.

The shift edge type of exposure mask can be easily manufactured because no shading layer is provided for the exposure mask.

However, an arranged pattern of the phase shifters 32 differs from a formed pattern of the space sections on the semiconductor device because the space section is produced in specific fields aligned with the narrow boundary. Therefore, the exposure mask can be utilized to manufacture a specific type of semiconductor device.

FIG. 6 is a graphic view showing the resolving power of three types of exposure masks shown in FIGS. 3A, 4A, and 5A, this resolving power being estimated by utilizing an image contrast.

FIG. 7 is a graphic view showing the focus margin of the three types of exposure masks shown in FIGS. 3A, 4A, and 5A, the focus margin being expressed by an image contrast.

The resolving power and the focus margin are estimated using a computer. The resolving power is expressed by the minimum pattern size in FIG. 6. The focus margin is expressed by allowable defocus values.

As shown in FIG. 6, the minimum pattern size for manufacturing a semiconductor circuit can be estimated by utilizing an image contrast between the dark and bright lights composing the light transmitted through the exposure mask. That is, the minimum pattern size is determined, when the value of the image contrast agrees with an allowable image contrast value.

For example, the minimum pattern size is estimated to be 0.17 μm for the Levenson and shift edge types of exposure masks (σ=0.2), 0.22 μm for the Levenson type of exposure mask (σ=0.5), 0.27 μm for the self-aligned type of exposure mask (δ1=0.04 μm, σ=0.5), and 0.3 μm for an exposure mask with no phase-shifting mask on condition that a numerical aperture NA equals 0.42 and the wavelength λ of the exposure light equals 248 nm. Here, as is well known, the symbol σ indicates a ratio of the NA of an imaging lens to the NA of a focusing lens.

As shown in FIG. 7, defocus values can be calculated by utilizing the value of the image contrast estimated in cases where the semiconductor device exposed by an exposure light is arranged out of focus. That is, when the value of the image contrast agrees with the allowable image contrast value, the absolute defocus value indicates the focus margin.

For example, the focus margin is estimated to be 0.9 μm in the Levenson and shift edge types of exposure masks (σ=0.2), 0.45 μm in the Levenson type of exposure mask (σ=0.5), and 0.35 μm in the self-aligned type of exposure mask (δ1=0.04 μm, σ=0.5), while no focus margin is estimated for the exposure mask with no phase-shifting mask on condition that the numerical aperture NA equals 0.42 and the wavelength λ of the exposure light equals 248 nm.

Therefore, the resolving power and the focus margin are improved to some extent by utilizing the Levenson and shift edge types of exposure masks as compared with the conventional method. Moreover, the resolving power and the focus margin are slightly improved by utilizing the shift edge type of exposure mask.

However, the Levenson type of exposure mask is not appropriate for use in practice because the Levenson type requires a specific arrangement whereby the phase shifters 13 and shading films 12 are repeatedly arranged at regular intervals.

Moreover, all types of exposure masks are made by a chemical vapor deposition (CVD) method in which vaporized silicone oxide ($S_2O_2$) is chemically deposited on a quartz substrate to form phase shifters. Therefore, the phase shifters are rapidly formed so that it is difficult to control their thickness. Moreover, it is difficult to uniformly adjust the thickness of all phase shifters because the deposition rate is not uniform over the entire quartz substrate in the CVD method. According to the principle of the phase-shifting method, the unevenness in the thickness of the phase shifters leads to unevenness in the phase of the shifted exposure light, so that the resolving power and the focus margin deteriorate to a considerable extent.

Further, the refractive index of the phase shifter differs from that of the quartz substrate regardless of whether the same material is utilized. Therefore, multi-reflection of exposure light is generated between the quartz substrate and the phase shifter.

SUMMARY OF THE INVENTION

A first object of the present invention is to provide, with due consideration to the drawbacks of such conventional methods, a method for easily manufacturing an exposure mask in which the thickness of the phase shifters is uniformly adjusted.

A second object of the present invention is to provide an exposure mask in which phase shifters resist an acid solution and the refractive index of the phase shifter is exactly the same as that of the quartz substrate.

The first object is achieved by the provision of a method for manufacturing an exposure mask wherein the exposure mask is provided with a substrate for transmitting an exposure light and with phase shifters arranged at prescribed intervals on the substrate for shifting the phase of the exposure light transmitted through the substrate by a half wavelength as compared with the phase of the exposure light transmitted through both the substrate and an opening between the phase shifters, comprising the steps of:

preparing a solution in which a phase shifter material is dissolved;

arranging resist layers at the prescribed intervals on the substrate, the material of the phase shifter being prevented from adhering to the resist layers;

immersing the substrate with the resist layers in the solution containing the phase shifter material;

forming the phase shifters on the substrate between the resist layers to a prescribed thickness by depositing the phase shifter material from the solution;

removing the substrate with the phase shifters from the solution; and removing the resist layers from the substrate to form the openings.

In the above steps, the phase shifter material is slowly deposited on the substrate between the resist layers in the solution so that the phase shifters are formed on the substrate. The deposition speed of the phase shifter is about 1000 Å/Hr so that the speed is very low as compared with that in the CVD method. Moreover, the phase shifters are formed at positions between the resist layers in self-alignment because the phase shifter material cannot adhere to the resist layer.

Thereafter, the resist layers are removed by utilizing, for example, a specific solution reacting to the resist layers and not reacting to the phase shifters. The resist layers can be removed because the phase shifter material is not deposited on the resist layers.

Therefore, a shift edge type of exposure mask which is the same type of the exposure mask shown in FIG. 5 is obtained.

Accordingly, the film thickness of the phase shifter can be accurately controlled because the phase shifter is slowly deposited. Moreover, the phase shifters are uniformly deposited because the phase shifters are deposited in the solution in which the phase shifter material is uniformly dissolved.

Therefore, dark and bright lights composing the light transmitted through the exposure mask can be clearly distinguished because the dark light is considerably decreased in a specific optical path aligned with the boundary region between the phase shifter and the opening after one diffracted exposure light transmitted through both the substrate and the phase shifter is subjected to optical interference with another diffracted exposure light transmitted through both the substrate and the opening. That is, the image contrast between the dark and bright lights shown in FIGS. 6, 7 can be considerably improved.

Moreover, the phase shifters are highly dense as compared with those in the CVD method. As a result, the refractive index of the phase shifter is exactly the same as that of the quartz substrate.

Moreover, the above object is achieved by the provision of a method for manufacturing an exposure mask in which the phase of an exposure light transmitted from a substrate to a phase shifter is shifted by a half wavelength as compared with the phase of the exposure light transmitted from the substrate to an opening between the phase shifters, comprising the steps of:

arranging shading films at prescribed intervals on the substrate, the exposure light transmitted through the substrate being shaded by the shading films;

preparing a solution in which a material of the phase shifter is dissolved;

arranging resist layers on the substrate between the shading films, the phase shifter material being prevented from adhering to the resist layers;

immersing the substrate with the shading films and the resist layers into the solution in which the material of the phase shifter is dissolved;

forming the phase shifters on the shading films between the resist layers to a prescribed thickness by depositing the phase shifter material from the solution;

removing the substrate with the phase shifters from the solution;

removing the resist layers from the substrate to form the openings; and removing a strip of a regular width from both edges of the resist layers, the phase shifters being overhung by the regular width on the shading films.

In the above steps, the phase shifter material is slowly deposited on the shading films between the resist layers in the solution, so that the phase shifters are formed on the shading films. The deposition speed of the phase shifter is about 1000 Å/Hr so that the speed is very low as compared with that in the CVD method. Moreover, the phase shifters are formed at positions between the resist layers in self-alignment because the material of the phase shifter cannot adhere to the resist layer.

Thereafter, the resist layers are removed by utilizing, for example, a specific solution reacting to the resist layers and not reacting to the phase shifters. Then, both edges of the shading films are removed, for example, by a wet etching. That is, the phase shifters overhang the shading films. Therefore, the self-aligned type of exposure mask which is the same as the exposure mask shown in FIG. 4 is manufactured.

Accordingly, the film thickness of the phase shifter can be accurately controlled because the phase shifter is slowly deposited. Moreover, the phase shifters are uniformly deposited because the phase shifter material is uniformly dissolved in the solution.

Therefore, the dark and bright lights composing the light transmitted through the exposure mask can be clearly distinguished because the dark light is considerably decreased in a specific optical path aligned with the phase shifter after one diffracted exposure light transmitted through both the substrate and the phase shifter is subjected to optical interference with another diffracted exposure light transmitted through both the substrate and the opening. That is, the image contrast between the dark and bright lights shown in FIGS. 6, 7 can be considerably improved.

Moreover, the phase shifters are highly dense as compared with those in the CVD method. As a result, the refractive index of the phase shifter is exactly the same as that of the quartz substrate.

Further, the above object is achieved by the provision of a method for manufacturing an exposure mask in which the phase of an exposure light transmitted from a substrate to a phase shifter is shifted by a half wavelength as compared with the phase of the exposure light transmitted from the substrate to an opening between the phase shifters, comprising the steps of:

arranging shading films at prescribed intervals on the substrate, the exposure light transmitted through the substrate being shaded by the shading films;

preparing a solution in which a phase shifter material is dissolved;

preparing a specific solution;

arranging resist layers on the substrate, the layers being removable by the specific solution; underexposing the resist layers to a specific light transmitted from the substrate to the resist layers;

forming exposed resist layers in the internal parts of the resist layers at a regular distance away from the shading films, the exposed resist layers not being removable by the specific solution and to which the phase shifter material does not adhere;

removing the resist layers other than the exposed resist layers by utilizing the specific solution;

immersing the substrate with the shading films and the exposed resist layers in the solution in which the phase shifter material is dissolved;

forming the phase shifters on the shading films and the substrate between the exposed resist layers to a prescribed thickness by depositing the phase shifter material from the solution;

removing the substrate with the phase shifters from the solution; and removing the resist layers from the substrate to form the openings.

In the above steps, the resist layers are exposed to a specific light such as ultra-violet radiation through the substrate. Because the specific light is transmitted between the shading films, the light intensity, as is well known, decreases near the shading films as compared with the internal part of the resist layers. Therefore, in cases where the resist layers is underexposed to the specific light, the resist layers near the shading films are not exposed because a minimum exposure is required to expose the resist layers.

In the present invention, the exposure time of the light is adjusted to form the exposed resist layer at a regular distance from the shading films.

Thereafter, the resist layers not exposed to the specific light are removed. Then, the phase shifter material is slowly deposited on the shading films and the substrate between the exposed resist layers in the solution, so that the phase shifters are formed on the shading films and the substrate. The deposition speed of the phase shifter is about 1000 Å/Hr so that the speed is very low as compared with that in the CVD method. Moreover, the phase shifters are formed positions between the exposed resist layers in self-alignment because the phase shifter material cannot adhere to the exposed resist layers.

Thereafter, the exposed resist layers are removed by utilizing another specific solution reacting to the exposed resist layers and not reacting to the phase shifters.

Therefore, the self-aligned type of exposure mask which is the same as the exposure mask shown in FIG. 4 is obtained.

Accordingly, the film thickness of the phase shifter can be accurately controlled because the phase shifter is slowly deposited. Moreover, the phase shifters are uniformly deposited because the phase shifters are deposited in the solution.

Therefore, the dark and bright lights composing the light transmitted through the exposure mask can be clearly distinguished because the dark light is considerably decreased in a specific optical path aligned with the phase shifter deposited on the substrate after one diffracted exposure light transmitted through both the substrate and the phase shifter is subjected to optical interference with another diffracted exposure light transmitted through both the substrate and the opening. That is, the image contrast between the dark and bright lights shown in FIGS. 6, 7 can be considerably improved.

Moreover, the phase shifters are highly dense as compared with those in the CVD method. As a result, the refractive index of the phase shifter is exactly the same as that of the quartz substrate.

The second object is achieved by the provision of an exposure mask for decreasing the intensity of a part of exposure light by the optical interference of a first diffracted exposure light with a second diffracted exposure light of which the phase is shifted by a half wavelength as compared with the phase of the first diffracted exposure light and for outputting an interfered exposure light alternately arranged by high and low intensity of exposure lights, comprising:

a substrate with a prescribed refractive index for transmitting the exposure light; and phase shifters formed by depositing a material with the prescribed refractive index from a solution in which the material is dissolved at prescribed intervals and to a regular thickness on the substrate for shifting the phase of the exposure light transmitted through the substrate, (1) the first diffracted exposure light being transmitted through both the substrate and an opening between the phase shifters, and (2) the second diffracted exposure light being transmitted through both the substrate and the phase shifter.

In the above configuration of the shift edge type of exposure mask shown in FIG. 5, because the phase shifters are slowly deposited from the solution, the phase shifters are uniformly formed at a regular thickness. Moreover, the phase shifters are highly dense so that the refractive index of the phase shifter becomes exactly the same as that of the substrate.

Accordingly, the bright and dark lights which are generated by optical interference of both the first and second diffracted exposure lights can be clearly distinguished because the phase shifters are uniformly formed at a regular thickness.

Moreover, the exposure light transmitted through the substrate is not reflected by the phase shifter because the refractive index of the phase shifter is exactly the same as that of the substrate. That is, the light intensity of the first diffracted exposure light is exactly the same as that of the second diffracted exposure light so that there is complete interference between the exposure lights.

Moreover, the second object is achieved by the provision of an exposure mask for decreasing the intensity of a part of the exposure light by optical interference of a first diffracted exposure light with a second diffracted exposure light of which the phase is shifted by a half wavelength as compared with the phase of the first diffracted exposure light and for outputting an interfered exposure light alternately arranged by high and low intensity of exposure lights, comprising:

a substrate with a prescribed refractive index for transmitting the exposure light;

shading films initially arranged at first intervals on the substrate, of which the edges are removed to be arranged at second intervals larger than the first intervals for shading the exposure light transmitted through the substrate; and phase shifters formed by depositing a material with a prescribed refractive index, in a solution in which the material is dissolved, at prescribed intervals and to a regular thickness on the shading films arranged at the first intervals for shifting the phase of the exposure light transmitted through the substrate, the first diffracted exposure light being transmitted through both the substrate and an opening between the phase shifters and the second diffracted exposure light being transmitted through both the substrate and the phase shifter.

In the above configuration of the self-aligned type of exposure mask which is the same as the exposure mask shown in FIG. 4, because the phase shifters are slowly deposited in the solution, the phase shifters are uniformly formed to a regular thickness. Moreover, the phase shifters are highly dense so that the refractive index of the phase shifter becomes exactly the same as that of the substrate.

Accordingly, the bright and dark lights which are generated by optical interference between the first and second diffracted exposure lights can be clearly distinguished because the phase shifters are uniformly formed to a regular thickness.

Moreover, the exposure light transmitted through the substrate is not reflected by the phase shifter because the refractive index of the phase shifter is exactly the same as that of the substrate. That is, the light intensity of the first diffracted exposure light is exactly the same as that of the second diffracted exposure light so that there is complete interference between the exposure lights.

BRIEF DESCRIPTION OF THE DRAWINGS

FIGS. 1A, 1C, and 1E are cross sectional views showing a conventional method for manufacturing a conventional exposure mask which is utilized to form line sections and space sections on an exposed semiconductor device.

FIGS. 1B, 1D, and 1F are cross sectional views showing another conventional method for manufacturing another conventional exposure mask which is utilized to make an isolated space section on an exposed semiconductor device.

FIGS. 2A, 2B are cross sectional view of the conventional exposure masks manufactured by the method shown in FIGS. 1A to 1F.

FIGS. 2C, 2D show the amplitude of the exposure lights transmitted from the quartz substrate 2 to the phase shifter 6, 7 or the opening 4.

FIG. 3A is a cross sectional view of a Levenson type of phase-shifting mask.

FIG. 3B shows the amplitude distribution of an exposure light transmitted through the mask shown in FIG. 3A in cases where the light is regarded not to be optically diffracted. FIG. 3C shows the amplitude distribution of an exposure light after the light is optically diffracted by shading layers shown in FIG. 3A.

FIG. 3D shows the intensity distribution of the exposure light of which the amplitude is shown in FIG. 3C.

FIG. 3E shows space and line sections formed on a semiconductor device after the device is exposed to the exposure light transmitted through the exposure mask shown in FIG. 3A.

FIG. 4A is a cross-sectional view of a self-aligned exposure mask with a phase shifting mask FIG. 4B shows the amplitude distribution of an exposure light transmitted through the mask shown in FIG. 4A in cases where the light is regarded to be not optically diffracted.

FIG. 4C shows the amplitude distribution of an exposure light after the light is optically diffracted by phase shifters shown in FIG. 4A.

FIG. 4D shows the intensity distribution of the exposure light of which the amplitude is shown in FIG. 4C.

FIG. 4E shows space and line sections formed on a semiconductor device after the device is exposed to the exposure light transmitted through the exposure mask shown in FIG. 4A.

FIG. 5A is a cross sectional view of a shift edge type of phase-shifting mask.

FIG. 5B shows an amplitude distribution of an exposure light transmitted through the mask shown in FIG. 5A in cases where the light is regarded to be not optically diffracted.

FIG. 5C shows an amplitude distribution of an exposure light after the light is optically diffracted by the phase shifter shown in FIG. 5A.

FIG. 5D shows an intensity distribution of the exposure light of which the amplitude is shown in FIG. 5C. FIG. 5E shows space and line sections formed on a semiconductor device after the device is exposed to the exposure light transmitted through the exposure mask shown in FIG. 5A.

FIG. 6 is a graphic view showing the resolving power of three types of exposure masks shown in FIGS. 3A, 4A, and 5A, the resolving power being estimated by utilizing an image contrast.

FIG. 21 shows an apparatus for forming a phase shift mask capable of drawing patterns according to yet another embodiment with a phase difference of 180°.

FIG. 22 shows still another embodiment of an apparatus for forming a phase shift mask capable of drawing patterns only the phase shift or having a phase difference of 180°.

DETAILED DESCRIPTION OF THE PREFERRED EMBODIMENTS

The preferred embodiments according to the present invention are described with reference to FIGS. 8 to 11.

FIGS. 8A to 8G are sectional views showing a method for manufacturing a self-aligned type of exposure mask according to a first embodiment of the present invention.

Figure 7:
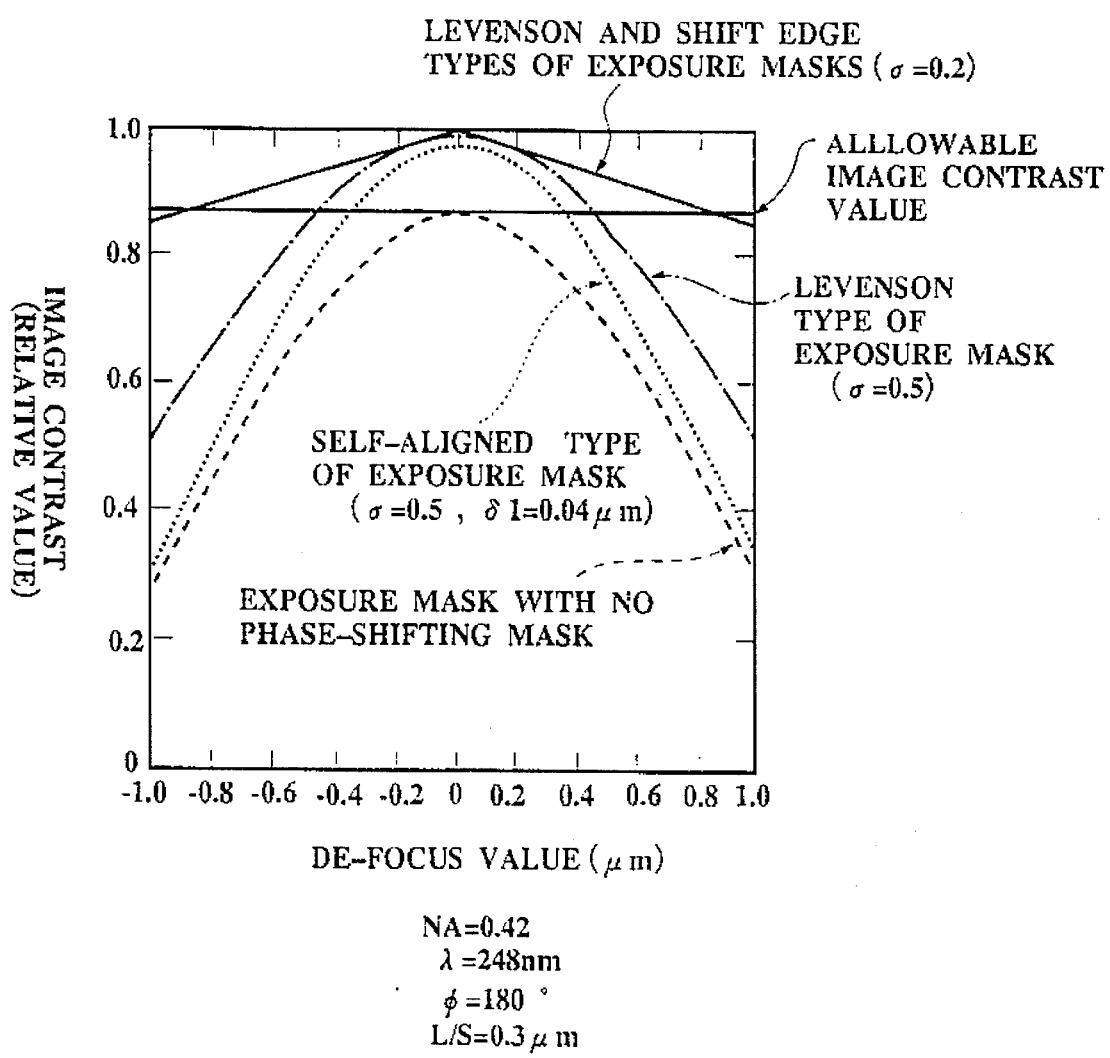
FIG. 7 is a graphic view showing the focus margin of three types of exposure masks shown in FIGS. 3A, 4A, and 5A, the focus margin being estimated by utilizing an image contrast.
Figure 8A:
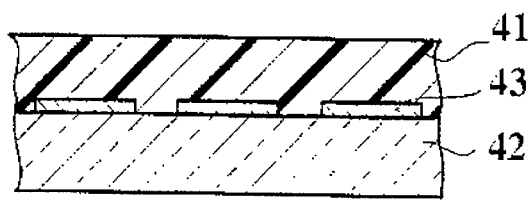
FIGS. 8A to 8G are sectional views showing a method for manufacturing a self-aligned type of exposure mask according to a first embodiment of the present invention.

As shown in FIG. 8A, a negative type of resist layer 41 in which one of the principal components is a p-hydroxystyrene is rotationally applied to the surface of a quartz substrate 42 on which shading films 43 are attached. The thickness of the resist layer 41 is about 12000 Å. Then, the quartz substrate 42 applied the resist layer 41 is baked for one minute at a temperature of 120° C.

Figure 8B:
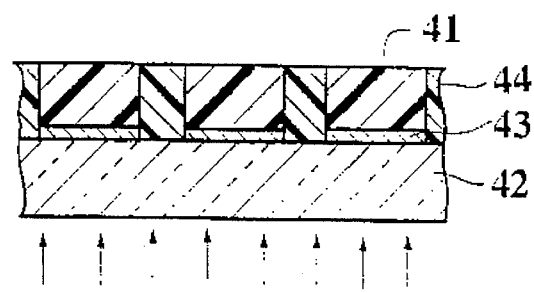

Thereafter, as shown in FIG. 8B, the quartz substrate 42 and the resist layer 41 are irradiated by a light generated by a Xe-Hg lamp. That is, a light of which the wavelength is in the range from 2400 Å to 3000 Å is applied from the back of the quartz substrate 42 (shown by arrows) to the resist layer 41 for about 5 minutes. As a result, parts of the resist layer 41 are not shaded by the films 43, so that latent image layers 44 are formed on the parts of the exposed resist layer 41.

Figure 8C:
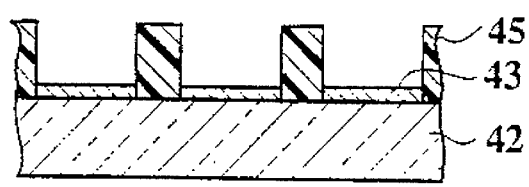

Thereafter, the latent image layers 44 are developed in a developer for 2 minutes to form exposed resist layers 45. The developer is a solution including 2.38 wt % tetramethyl-ammonium hydroxide. Then, as shown in FIG. 8C, no exposed resist layers on the shading films 43 are removed from the resist layer 41, so that a stripe pattern of the exposed resist layers 45 is formed on the quartz substrate 42 between the shading films 43.

Figure 8D:
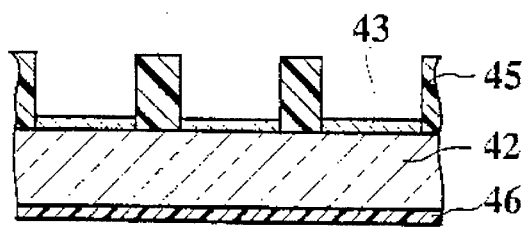

Thereafter, a solution in which one of the principal components is a polyvinyl acetate is sprayed onto the back surface of the quartz substrate 42 and onto all sides of the quartz substrate 42. Then, the quartz substrate 42 sprayed with the solution is dried in the atmosphere, so that a protective layer 46 made of the sprayed solution is formed as shown in FIG. 8D. The protective layer 46 protects the quartz substrate 42 from being eroded by an acid solution utilized in a silicon-oxide-at-room-temperature-deposition (SORD) method.

Figure 8E:
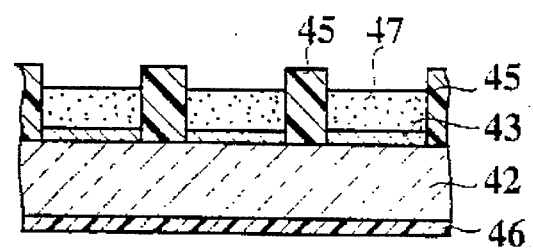

Thereafter, as shown in FIG. 8E, silicon dioxide films 47 are formed on the shading films 43 between the exposed resist layers 45 by utilizing the SORD method. The SORD method is described in detail as follows.

The quartz substrate 42 with the exposed resist layers 45 and the protective layer 46 is immersed in a hydro silicofluoric acid ($H_2SiF_6$) solution in which a silicon dioxide ($SiO_2$) is dissolved at saturation. Then, a boric acid ($H_3BO_3$) solution is added in the hydro silicofluoric acid solution. The concentration of the boric acid solution is, for example, 0.5 mol/l and the mixed solution is maintained at a temperature of 35° C.

As a result, as shown in FIG. 8E, the silicon dioxide films 47 are deposited in self-alignment on the shading films 43 between the exposed resist layers 45. The thickness of the silicon dioxide films 47 is exactly 2400 Å.

Because the exposed resist layers 45 are an organic substance, the silicon dioxide which is not an organic substance is not deposited on the exposed resist layers 45. Therefore, the silicon dioxide films 47 are selectively positioned between the exposed resist layers 45.

Moreover, the silicon dioxide films 47 are slowly formed at a rate of about 1000 Å/Hr. Further, the concentration of the hydro silicofluoric acid and the boric acid is uniformly maintained over the entire mixed solution because these acids react slowly.

The thickness of the silicon dioxide films 47 is set at $\lambda/2(n-1)$ because the films 47 are utilized to shift an exposure light by a half wavelength when the exposure mask with the films 47 is utilized to manufacture a semiconductor integrated circuit in an exposure step. That is, the films 47 are utilized as the phase shifters shown in FIG. 4. Here, the symbol $\lambda$ indicates the wavelength of the exposure light and the symbol n indicates the refractive index of the silicon dioxide films 47.

In this embodiment, the refractive index of the silicon dioxide films 47 equals 1.5 (n=1.5). Because the quartz substrate 42 is made of the silicon dioxide, the refractive index of the substrate 42 is the same as that of the films 47. The exposure light is generated by a KrF excimer laser source. The wavelength of the exposure light is 2400 Å ($\lambda$=2400 Å). Therefore, the thickness of the films 47 is set at 2400 Å.

Figure 8F:
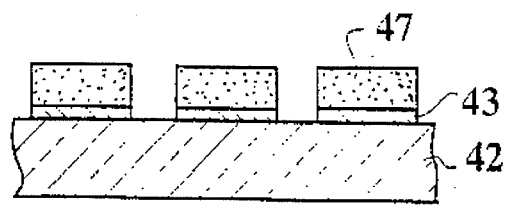

Thereafter, the quartz substrate 42 with the deposited silicon dioxide films 47 is disposed in a resist ashing unit with an oxygen gas plasma generating system. The substrate 42 is exposed to the oxygen gas plasma in the unit for 30 minutes so that the exposed resist layers 45 and the protective layer 46 are ashed and removed as shown in FIG. 8F.

Figure 8G:
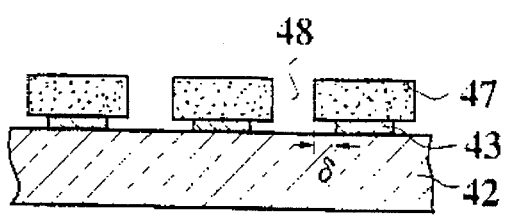

Thereafter, the edges of the shading films 43 are etched for 6 seconds by utilizing a chromium etching solution according to an isotropic wet etching method. Therefore, the silicon dioxide films 47 overhang the shading films 43 by a 0.04 μm width ($\delta$=0.04 μm) as shown in FIG. 8G. The overhanging portions in the silicon dioxide films 47 function as the phase shifter described in FIG. 4.

When the width of the overhanging portion is 0.04 μm on the shading films 43, one exposure light transmitted through both the substrate 42 and the silicon dioxide film 47 optically interferes with another exposure light transmitted through both the substrate 42 and an opening 48 between the silicon dioxide films 47. That is, as is well known, a stripe pattern which is formed by alternately arranging dark and bright lights composing the exposure light transmitted through the exposure mask shown in FIG. 8G is very clear.

As mentioned above, the self-aligned type of exposure mask is manufactured by utilizing the SORD method.

In the exposure mask manufactured by utilizing the SORD method, the exposed resist layers 45 can be ashed and removed by utilizing the ashing unit without being disturbed by the silicon dioxide because the silicon dioxide is not deposited on the exposed resist layers 45.

Because the silicon dioxide dissolved in the mixed solution is positioned on the shading films 43 in self-alignment before the edges of the shading films 43 are etched, the silicon dioxide films 47 can be easily arranged at prescribed intervals on the shading films 43. That is, a large-scale electron beam unit with an alignment system is not required to manufacture the exposure mask according to this embodiment, so that a large quantity of data and complicated data processing are not required.

In addition, because the self-aligned type of exposure mask is manufactured, no auxiliary opening is required to form phase shifters such as the silicon dioxide films 47 regardless of whether or not the isolated space section is formed on the semiconductor device.

Also, because the silicon dioxide films 47 are slowly deposited, the thickness of the silicon dioxide films 47 can be precisely adjusted.

Because the concentration of the hydro silicofluoric acid and the boric acid is uniformly maintained over the entire mixed solution, the silicon dioxide can be uniformly deposited over the entire quartz substrate 42. That is, all the silicon dioxide films 47 can be precisely adjusted to the same thickness.

Because the SORD method is implemented at a room temperature of, for example, 35° C., safe work can be guaranteed and the work can be easily implemented.

Also, the silicon dioxide films 47 are highly dense because the SORD method is utilized as compared with the CVD method. Therefore, the acid resisting properties of the films 47 is superior to the phase shifters formed by the CVD method. Moreover, the refractive index of the silicon dioxide films 47 is exactly the same as that of the quartz substrate 42, while the phase shifter 23 formed by the CVD method is not exactly the same as the quartz substrate 21, as shown in FIG. 4.

Next, the exposure mask manufactured by utilizing the SORD method was attached to a KrF excimer laser stepper with a project lens of NA=0.42. Then, the exposure light generated by the KrF excimer laser source was exposed to a novolak type of positive resist of a thickness of 0.5 μm, applied on a semiconductor device. As a result, a striped pattern in which light and dark light fields are alternately arranged at 0.2 μm intervals is precisely obtained on the semiconductor device. Moreover, the striped pattern was reproduced.

Accordingly, the resolving power of the stepper utilizing the exposure mask manufactured by utilizing the SORD method is 0.2 μm, while the resolving power in the conventional self-aligned type of the exposure mask shown in FIG. 4 is 0.27 μm.

The reason that the resolving power is improved is because the thickness of the silicon dioxide films 7 can be precisely and uniformly adjusted and their density is increased.

Therefore, when a semiconductor circuit is manufactured in an exposure step, the striped pattern can be precisely obtained by utilizing the exposure mask manufactured by utilizing the SORD method.

Next, a second embodiment of the present invention is described with reference to FIGS. 9A to 9E.

FIGS. 9A to 9E are sectional views showing a method for manufacturing another self-aligned type of exposure mask according to a second embodiment of the present invention.

Figure 9A:
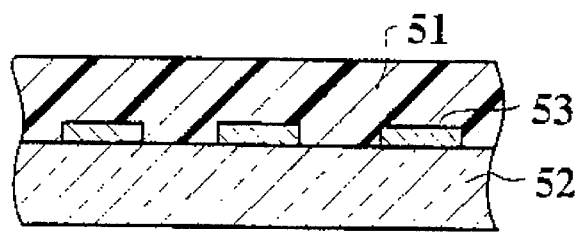
FIGS. 9A to 9E are sectional views showing a method for manufacturing another self-aligned type of exposure mask according to a second embodiment of the present invention.

As shown in FIG. 9A, a negative type of resist layer 51 in which one of the principal components is a cresol novolak resin is rotationally applied to the surface of a quartz substrate 52 on which shading films 53 formed from chromium thin films are attached. The thickness of the resist layer 51 is about 13000 Å. Then, the quartz substrate 52 coated with the resist layer 51 is baked for one minute at a temperature of 90° C.

Figure 9B:
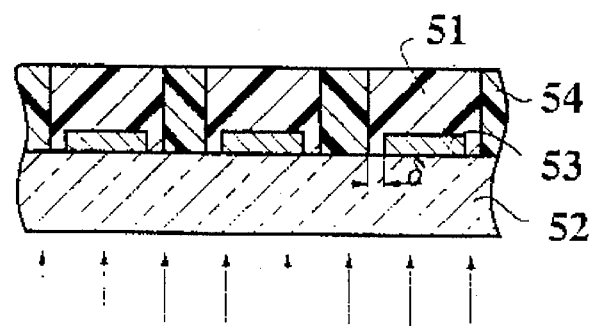

Thereafter, as shown in FIG. 9B, the quartz substrate 52 and the resist layer 51 are irradiated by a light generated by a Xe-Hg lamp. That is, a light with a wavelength in the range from 2400 Å to 3000 Å is applied from the back of the quartz substrate 52 (shown by arrows) to the resist layer 51. In this case, the intensity of the light is, as is well known, strongest in the center between the shading films 53 and is decreased as the interval from the shading films 53 becomes smaller. Moreover, the minimum exposure of light is required to expose all the resist layer 51 between the shading films 53 in the same manner as in the first embodiment. In this embodiment, the resist layer 1 is exposed to the light at less than the minimum exposure. As a result, the resist layer 51 is not exposed within the interval of 0.04 μm (δ=0.04 μm) from the shading film 53 because of the underexposure. Therefore, latent image layers 54 are formed by the exposed resist layer 51 in a separate region exceeding the interval of 0.04 μm from the shading films 53.

Figure 9C:

Thereafter, the latent image layers 54 are developed to form exposed resist layers 55 in a developer including 2.38 wt % tetra-methyl-ammonium hydroxide for 2 minutes. Then, as shown in FIG. 9C, no exposed resist layers are removed from the resist layer 51, so that a striped pattern of the exposed resist layers 55 is formed on the quartz substrate 52 between the shading films 53.

Thereafter, a protective layer 56 made of a polyvinyl acetate is sprayed onto the back surface of the quartz substrate 52 and onto all sides of the quartz substrate 52 and is baked in the same manner as the protective layer 46 in the first embodiment.

Figure 9D:
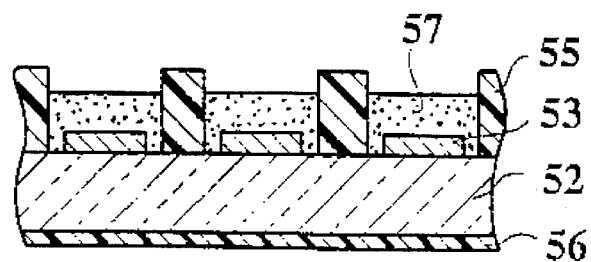

Thereafter, as shown in FIG. 9D, silicon dioxide films 57 are formed on the shading films 53 and the quartz substrate 52 between the exposed resist layers 55 by utilizing the SORD method in the same manner as in the first embodiment. The silicon dioxide films 57 formed on the quartz substrate 52 function as the phase shifter described in FIG. 4.

Thereafter, the SORD method is implemented in the same manner as in the first embodiment. That is, the quartz substrate 52 with the exposed resist layers 55 and the protective layer 56 is immersed in the hydro silicofluoric acid solution. Then, the 0.5 mol/l boric acid solution is added to the hydro silicofluoric acid solution. The mixed solution is maintained at a temperature of 35° C. Then, the silicon dioxide films 57 are slowly deposited in self-alignment between the exposed resist layers 55 at a rate of about 1000 Å/Hr. The thickness of the silicon dioxide films 57 is exactly 2400 Å. Therefore, the exposure light generated by a KrF excimer laser source is shifted by a half wavelength when the exposure light is transmitted through the films 57 as compared with the exposure light not transmitted through the films 57 because the refractive index of the silicon dioxide films 47 is 1.5 (n=1.5) and the wavelength of the exposure light is 2400 Å (λ=2400 Å).

Figure 9E:
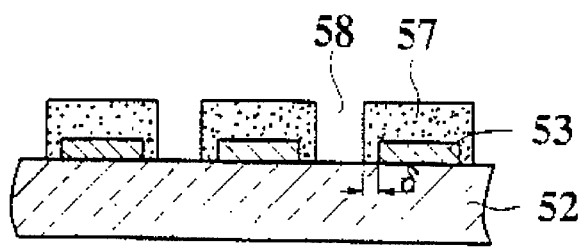

Thereafter, the exposed resist layers 55 and the protective layer 56 are ashed and removed as shown in FIG. 9E in the same manner as in the first embodiment. Therefore, openings 58 are formed between the silicon dioxide films 57 after the exposed resist layers 55 are removed. The exposed resist layers 55 overhanging from the shading films 53 are arranged on the quartz substrate 52 at a 0.04 μm width (δ=0.04 μm).

As mentioned above, the self-aligned type of exposure mask is manufactured by utilizing the SORD method.

In the exposure mask manufactured by utilizing the SORD method according to the second embodiment, one exposure light transmitted through the substrate 52 and the silicon dioxide film 57 arranged on the substrate 52 at the 0.04 μm width is diffracted by the film 57. Moreover, another exposure light transmitted through the substrate 52 and the opening 58 between the silicon dioxide films 57 width is diffracted by the films 57. The phase of one exposure light differs from that of the other exposure light by a half wavelength.

Therefore, both exposure lights are subjected to optical interference so that a striped pattern formed by bright and dark lights is formed in the outgoing exposure light.

Accordingly, because the phase shifters of 0.04 μm width can be easily manufactured by decreasing the intensity of the light generated by the Xe-Hg lamp, the wet etching implemented in the first embodiment is not required. The manufacturing method according to the second embodiment can therefore be simplified.

Because the light exposure can be strictly adjusted as compared with the adjustment of the wet etching rate in the first embodiment, the width of the phase shifters can be precisely adjusted.

In addition, the exposed resist layers 55 can be ashed and removed by utilizing the ashing unit without being disturbed by the silicon dioxide because the silicon dioxide is not deposited on the exposed resist layers 55.

Also, because the silicon dioxide dissolved in the mixed solution is positioned on the shading films 53 and the substrate 52 in self-alignment between the exposed resist layers 55, the silicon dioxide films 57 can be easily arranged on the substrate 52 at a 0.04 μm width. That is, a large-scale electron beam unit with an alignment system is not required to manufacture the exposure mask according to this embodiment, so that a large quantity of data and complicated data processing are not required.

In addition, because the self-aligned type of exposure mask is manufactured, no auxiliary opening is required to form phase shifters such as the silicon dioxide films 57 regardless of whether or not the isolated space section are formed on the semiconductor device.

Because the silicon dioxide films 57 are slowly deposited, the thickness of the silicon dioxide films 57 can be precisely adjusted.

Moreover, because the concentration of the hydro silicofluoric acid and the boric acid is uniformly maintained over the entire mixed solution, the silicon dioxide can be uniformly deposited over the entire quartz substrate 52. That is, all the silicon dioxide films 57 can be precisely adjusted to the same thickness.

Further, because the SORD method is implemented at a room temperature of, for example, 35° C., safe work can be guaranteed and the work can be easily implemented.

The silicon dioxide films 57 are highly dense because the SORD method is utilized as compared with the CVD method. Therefore, the acid resisting properties of the films 57 are superior to those of the phase shifters formed by the CVD method. Moreover, the refractive index of the silicon dioxide films 57 is exactly the same as that of the quartz substrate 52, while the phase shifter 23 formed by the CVD method is not exactly the same as the quartz substrate 21 as shown in FIG. 4.

Next, the exposure mask manufactured by utilizing the SORD method according to the second embodiment was attached to the KrF excimer laser stepper with the project lens of NA=0.42 and the exposure light was exposed to the novolak type of positive resist of 0.5 μm thickness to examine the resolving power in the same manner as in the first embodiment.

As a result, the resolving power of the stepper utilizing the exposure mask manufactured by utilizing the SORD method is 0.2 µm in the same manner as in the first embodiment. Therefore, when a semiconductor circuit is manufactured in an exposure step, the striped pattern can be precisely obtained by utilizing the exposure mask manufactured by utilizing the SORD method in the same manner as in the first embodiment.

Next, a third embodiment of the present invention is described.

The negative type of resist layer 51 is rotationally applied to the surface of the quartz substrate 52 on which the shading films 53 are attached and baked in the same manner as in the second embodiment.

Thereafter, the latent image layers 54 are formed in the internal portion of the resist layer 51 and are developed, then a striped pattern of the exposed resist layers 55 is formed on the quartz substrate 52 between the shading films 53 and the protective layer 56 is formed in the same manner as in the second embodiment.

Subsequently, silicon dioxide films 59 are formed on the shading films 53 and the quartz substrate 52 between the exposed resist layers 55 by utilizing a modified SORD method. The silicon dioxide films 59 formed on the quartz substrate 52 function as the phase shifter described in FIG. 4.

The modified SORD method is described in detail as follows.

The quartz substrate 52 with the exposed resist layers 55 and the protective layer 56 is immersed in the hydro silicofluoric acid ($H_2SiF_6$) solution which is controlled at a temperature of 5° C.

When the temperature of the solution is relatively low, for example, 5° C., the precipitation of the silicon dioxide is small. However, as the temperature of the solution is increased, the precipitation of the silicon dioxide is promoted and the volume of the precipitation is increased.

Thereafter, the temperature of the solution is gradually increased to 60° C. Therefore, the precipitation of the silicon dioxide is continued so that the silicon dioxide films 57 are deposited in self-alignment on the shading films 53 between the exposed resist layers 55 and are strictly adjusted to a thickness of 2400 Å.

The silicon dioxide films 57 are slowly formed at a rate of about 1000 Å/Hr. Moreover, the concentration of the hydrosilicofluoric acid is uniformly maintained over the entire solution because the acid is slowly reacted.

Thereafter, the exposed resist layers 55 and the protective layer manner as in the openings 58 dioxide films 59 removed, and the 56 are ashed and removed in the same second embodiment.

Openings 58 are therefore formed between the silicon dioxide films 57 after the exposed resist layers 55 are removed, and the exposed resist layers 55 are arranged on the quartz substrate 52 at a 0.04 µm width.

As mentioned above, the self-aligned type of exposure mask is manufactured by utilizing the modified SORD method according to the third embodiment.

Accordingly, because the precipitation of the silicon dioxide is continued by increasing the temperature of the solution so that the silicon dioxide films 57 are deposited, no added solution is required to promote and continue the precipitation of the silicon dioxide. Therefore, no impurities are added in solution so that mask defects resulting from impurities can be avoided.

Moreover, the remaining features and the resolving power of the exposure mask manufactured by the method according to the third embodiment are the same as those in the second embodiment.

The modified SORD method can be applied to the method according to the first embodiment in place of the SORD method. Although the SORD method and the modified SORD method are utilized in the first to third embodiments, it is preferable that pieces of aluminum metal be added to the hydro-silicofluoric acid ($H_2SiF_6$) solution in place of the addition of the boric acid solution in the SORD method or the increase of the temperature in the modified SORD method. A further modified SORD method for manufacturing an exposure mask by adding pieces of aluminum metal is described in detail as follows.

The quartz substrate 42 (52) with the exposed resist layers 45 (55) and the protective layer 46 (56) is immersed in the hydro silicofluoric acid ($H_2SiF_6$) solution which is maintained at a temperature of 35° C. Then, for example, pieces of aluminum metal are added to the hydrosilicofluoric acid solution.

As a result, hydrogen fluoride (HF) is gradually decomposed so that the silicon dioxide films 47 (57, 59) can be continuously deposited.

Moreover, though the negative type of resist layer 41 (51) is utilized in the first to third embodiments, it is preferable that a positive type of resist layer be utilized in place of the negative type of resist layer 41 (51) because the resist layer is removed to form the openings 48 (58) between the shading films 43 (53). An image reversal method in which a positive type of resist layer such as novolak including an aromatic amine compound is described as follows.

A positive type of novolak resin including an aromatic amine compound is rotationally applied to the surface of a quartz substrate 42 (52) on which shading films 43 (53) formed from chromium thin films are attached. The thickness of the positive type of novolak is about 12000 Å. Then, the quartz substrate 42 (52) applied the positive type of novolak is irradiated by an ultraviolet light from the back of the substrate 42 (52). Thereafter, the positive type of novolak irradiated by the light is baked for 10 minutes at a temperature of 120° C.

Thereafter, the positive type of novolak is irradiated by an ultraviolet light from the surface thereof so that the positive type of novolak on the shading films 43 (53) is exposed. Then, the exposed novolak is developed and removed. Therefore, no exposed novolak remains between the shading films 43 (53).

Moreover, it is preferable that the surface of the exposed resist layers 45 (55) be fluoridized prior to the deposition of the silicon dioxide films 47 (57, 59). In this case, the adhesive strength of the layers 45 (55) to the films 47 (57, 59) is lowered by the fluoridization of the layers 45 (55). As a result, The exposed resist layers 45 (55) can be easily removed after the silicon dioxide films 47 (57, 59) are deposited.

Next, a fourth embodiment of the present invention is described with reference to FIGS. 10A to 10D.

FIGS. 10A to 10D are sectional views showing a method for manufacturing an exposure mask according to the fourth embodiment.

Figure 10A:
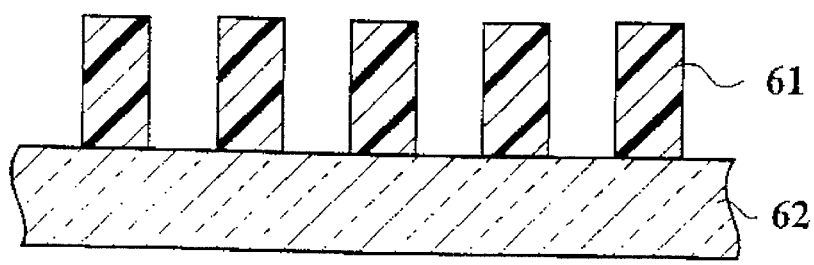
FIGS. 10A to 10D are sectional views showing a method for manufacturing an exposure mask according to the fourth embodiment.
Figure 10B:
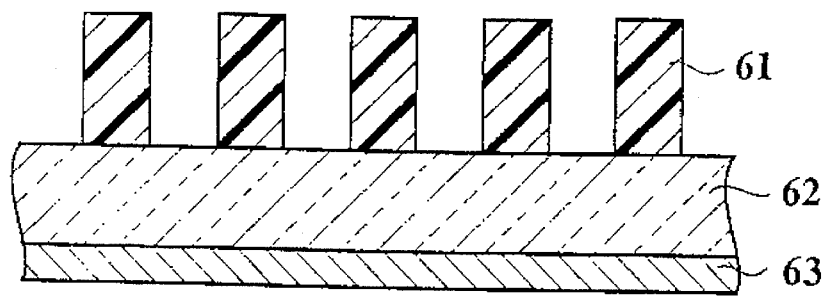

As shown in FIG. 10A, resist layers 61 are arranged to form a striped pattern on a transparent quartz substrate 62 by utilizing an electron beam patterning method. The resist layers 61 is about 1 µm thick. Moreover, a resist layer 63 is coated onto the back of the quartz substrate 62 and the sides of the quartz substrate 62 as shown in FIG. 10B. The resist layer 63 is coated by a resist coater or by hand to protect the substrate 62 from being eroded by the acid solution utilized in the SORD method.

Thereafter, the SORD method is implemented in the same manner as in the first method. That is, the quartz substrate 62 with the resist layers 61 is immersed in the hydro-silicofluoric acid solution. Then, the boric acid solution is added in the hydro-silicofluoric acid solution. The concentration of the boric acid solution is 0.5 mol/l and the mixed solution is maintained at a temperature of 35° C.

Figure 10C:
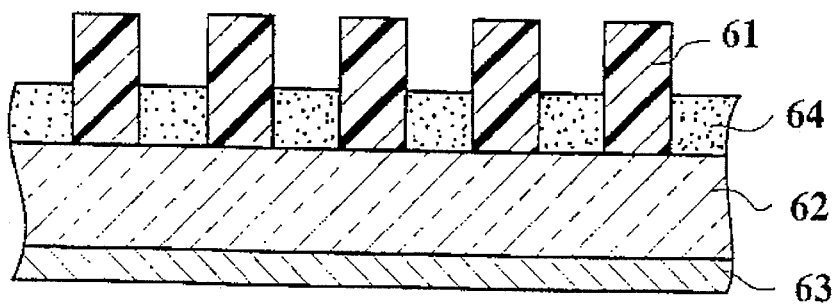

As shown in FIG. 10C, silicon dioxide films 64 are therefore deposited in self-alignment on the substrate 62 between the resist layers 61. At this time, the silicon dioxide is not deposited on the resist layers 61 because the layers 61 are made of an organic substance.

The silicon dioxide films 64 are exactly $\lambda/2(n-1)$ μm thick in the same manner as in the first method. Therefore, the silicon dioxide films 64 function as the phase shifters shown in FIG. 5.

Figure 10D:
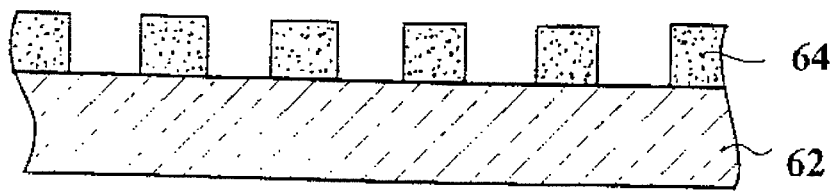

Thereafter, the resist layers 61, 63 are removed by immersing the substrate 62 with the deposited silicon dioxide films 64 in a removal solution such as sulfuric acid. Therefore, as shown in FIG. 10D, a shift edge type of exposure mask comprising the silicon dioxide films 64 functioning as the phase shifters and the quartz substrate 62 is manufactured.

In the shift edge type of exposure mask manufactured by the method according to the fourth embodiment, the resist layers 61 can be removed by the sulfuric acid without being disturbed by the silicon dioxide because the silicon dioxide is not deposited on the resist layers 61.

Moreover, because the silicon dioxide dissolved in the mixed solution is positioned on the quartz substrate 62 between the resist layers 61 in self-alignment, the silicon dioxide films 64 can be easily arranged at prescribed intervals on the substrate 62. That is, a large-scale electron beam unit with an alignment system is not required to manufacture the exposure mask according to this embodiment, so that a large quantity of data and complicated data processing are not required.

Because the silicon dioxide films 64 are slowly deposited, the thickness of the silicon dioxide films 64 can be precisely adjusted.

Because the concentration of the hydro silicofluoric acid and the boric acid is uniformly maintained over the entire mixed solution in the same manner as in the first embodiment, the silicon dioxide can be uniformly deposited over the entire quartz substrate 62. That is, all the silicon dioxide films 64 can be precisely adjusted to the same thickness.

Also, because the SORD method is implemented at a room temperature of, for example, 35° C., safe work can be guaranteed and the work can be easily implemented.

The silicon dioxide films 64 are highly dense because the SORD method is utilized as compared with the CVD method. Therefore, the acid resisting properties of the films 64 are superior to those of the phase shifters formed by the CVD method. Moreover, the refractive index of the silicon dioxide films 64 is exactly the same as that of the quartz substrate 62, while the phase shifter 32 formed by the CVD method is not exactly the same as the quartz substrate 31 as shown in FIG. 5. Further, the silicon dioxide films 64 do not change in size regardless of whether or not the exposure mask is utilized for a long time.

In the fourth embodiment, though the SORD method is utilized, it is preferable that the modified SORD method be utilized in the same manner as in the second embodiment in place of the SORD method.

Moreover, it is preferable that the further modified SORD method be utilized.

Next, a fifth embodiment of the present invention is described with reference to FIGS. 11A to 11D.

FIGS. 11A to 11D are sectional views showing a method for manufacturing an exposure mask integrally formed by both a shift edge type of phase-shifting mask and no phase-shifting mask according to the fifth embodiment.

Figure 11A:
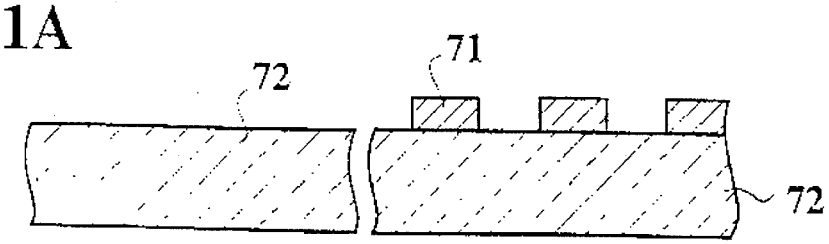
FIGS. 11A to 11E are sectional views showing a method for manufacturing an exposure mask integrally formed by both a shift edge type of phase-shifting mask and no phase-shifting mask according to the fifth embodiment.

As shown in FIG. 11A, shading films 71 are arranged at prescribed intervals to form a striped pattern on a first part of a quartz substrate 72. The first part of the substrate 72 is processed to produce an exposure mask with no phase-shifting mask. On the other hand, no shading film is arranged on the second part of quartz substrate 72. The second part of the quartz substrate 72 is processed to produce a shift edge type of phase-shifting mask.

Figure 11B:
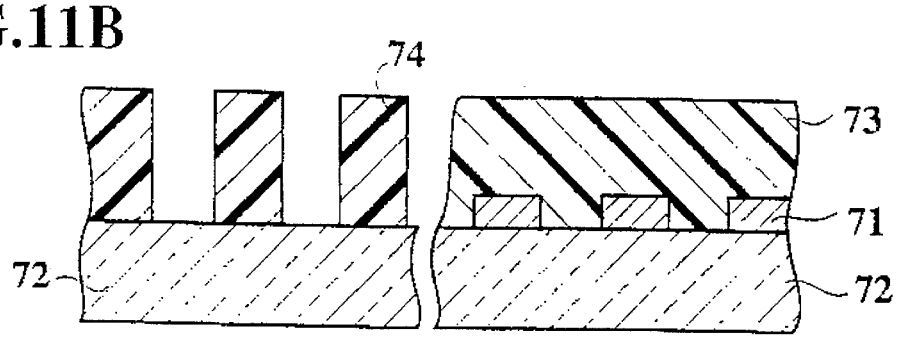

The shading films 71 are made of chromium or chromium oxide. The striped pattern arranged by the shading films 71 is formed by an electron beam patterning method. Thereafter, a resist layer 73 is coated over the entire quartz substrate 72. The resist layer 73 is about 1 μm thick. Then, as shown in FIG. 11B, the resist layer 73 on the second part of quartz substrate 72 is etched to form a prescribed striped pattern of resist layers 74 by the electron beam patterning method.

Figure 11C:
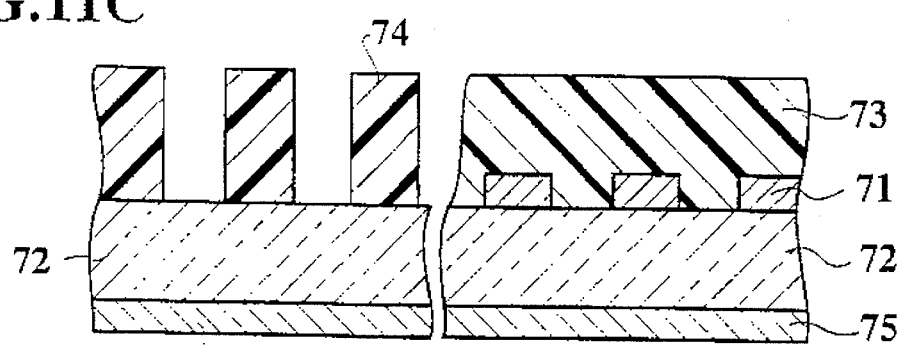

Moreover, as shown in FIG. 11C, a resist layer made of chromium or chromium oxide is coated onto the back of the substrate 72 and the sides of the substrate 72 to form protective layers 75. The protective layers 75 protect the substrate 72 from being eroded by an acid solution when the SORD method is implemented. The coating is implemented by a resist coater or by hand.

Thereafter, the SORD method is implemented in the same manner as in the first method. That is, the quartz substrate 72 with the resist layers 74 is immersed in the hydro-silicofluoric acid solution. Then, the boric acid solution is added to the hydro silicofluoric acid solution. The concentration of the boric acid solution is 0.5 mol/l and the mixed solution is maintained at a temperature of 35° C.

Figure 11D:
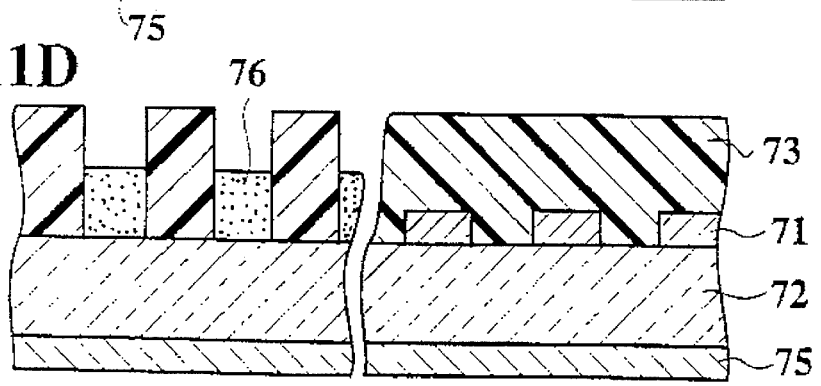

Therefore, as shown in FIG. 11D, silicon dioxide films 76 are deposited in self-alignment on the substrate 72 between the resist layers 74. At this time, the silicon dioxide is not deposited on the resist layers 73, 74 because the layers 73, 74 are made of an organic substance.

The silicon dioxide film 76 is exactly $\lambda/2(n-1)$ μm thick in the same manner as in the first method. Therefore, the silicon dioxide films 76 function as the phase shifters shown in FIG. 5.

Figure 11E:
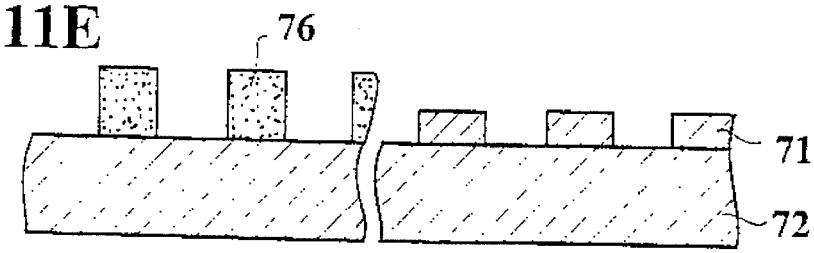

Thereafter, the resist layers 73, 74 and the protective layers 75 are removed by immersing the substrate 72 with the deposited silicon dioxide films 76 in a removal solution such as sulfuric acid. Therefore, as shown in FIG. 11E, an exposure mask integrally formed by both a shift edge type of phase-shifting mask and no phase-shifting mask is obtained.

In the shift edge type of exposure mask manufactured by the method according to the fifth embodiment, the resist layers 73, 74 and the protective layers 75 can be removed by the sulfuric acid without being disturbed by the silicon dioxide because the silicon dioxide is not deposited on the resist layers 73, 74 and the protective layers 75.

Moreover, because both a shift edge type of phase-shifting mask and no phase-shifting mask is integrally manufactured, the exposure mask is appropriate in cases where cell sections and peripheral circuits must be simultaneously patterned on a semiconductor device by irradiating bright and dark lights transmitted through the exposure mask. Usually, the cell sections must be minutely patterned so that it is difficult to pattern the cell sections by utilizing an exposure mask with a phase-shifting mask. On the other hand, the peripheral circuits need not be minutely patterned so that an exposure mask with a phase-shifting mask is appropriate to pattern the peripheral circuits.

Therefore, the exposure mask manufactured by the method according to the fifth embodiment is appropriate for simultaneously patterning the cell circuits and the peripheral circuits. That is, the bright and dark lights transmitted through the second part of the substrate 72 are irradiated on the semiconductor device to pattern the peripheral circuits, while the bright and dark lights transmitted through the first part of substrate 72 are irradiated to the semiconductor device to pattern the cell circuits.

Though the SORD method is utilized in the fifth embodiment, it is preferable that the modified SORD method be utilized in the same manner as in the second embodiment in place of the SORD method.

Moreover, it is preferable that the further modified SORD method be utilized.

The first to fifth embodiments according to the present invention, as described above, form a silicon oxide film serving as a phase shifter layer achieving high resolution, without growing the same on an exposed resist film such as the resist film 45 of FIG. 8E of the first embodiment. In the following embodiments we will describe methods of forming a phase shifter layer with high resolution on an exposed resist film in detail.

SIXTH EMBODIMENT

A mask is formed with a substrate and a resist film having a fixed thickness to cover the surface of the substrate. Firstly, the substrate is exposed to an atmosphere of hexamethyldisilazane for four minutes. The substrate is spin-coated with novolak-based photoresist containing orthodiazonaphthoquinone or orthoazonaphthoquinone as photosensitive material sensitive to light of 365 nanometers. The substrate is prebaked with a hot plate at 90 degrees centigrade for two minutes, to form the resist film 1312 of about 1.0 micrometer in thickness.

In order to test the quantity of silicon oxide particles growing on the resist film, specific processes are carried out after a patterning process is carried out without the patterning process. Namely, the resist film 1312 is developed with a developer containing 2.38% tetramethylammonium hydroxide (TMAH) and is divided into two areas. Silicon oxide film is deposited to a thickness of 200 nanometers in the two areas according to a liquid phase deposition method, with one of the areas being covered with a filter to block light of 365 nanometers in wavelength, or being exposed to a yellow lamp that cuts light of 560 nanometers or below, while the other area is exposed to a conventional fluorescent lamp.

Figure 12A:
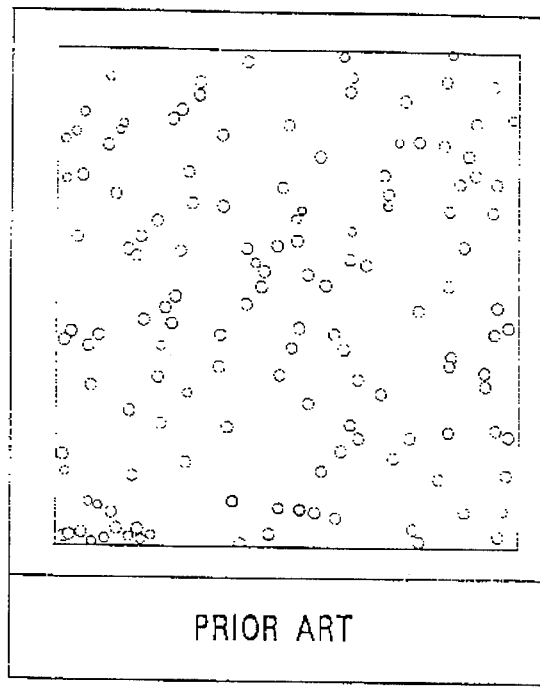
FIGS. 12A, B show microscope photographs of a resist film in accordance with the sixth embodiment.
Figure 12B:
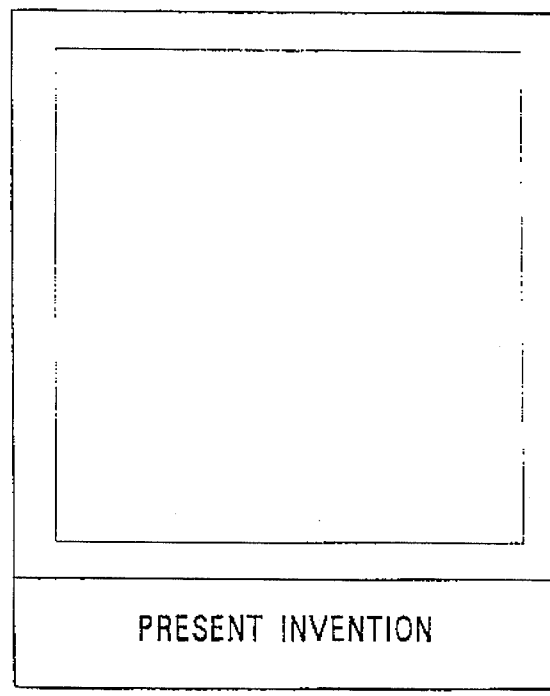

FIGS. 12A and 12B are models of microscope photographs of the above two areas.

FIG. 12A, which is of the area provided with no filter and exposed to the conventional fluorescent lamp, shows white spots indicating silicon oxide particles grown on the resist film 1312.

FIG. 12B, which is of the area provided with the filter or exposed to the yellow lamp, shows no white dots.

In this way, no silicon oxide particles grow on a resist film if a filter to block specific light is employed.

SEVENTH EMBODIMENT

FIGS. 13A to 13D are sectional drawings showing processes of forming a phase shift mask capable of drawing patterns only with a phase shifter having a phase difference of 180 degrees with respect to a substrate, according to the sixth aspect or embodiment of the present invention.

A transparent mask substrate 1311 is exposed to an atmosphere of hexamethyldisilazane for four minutes. The substrate 1311 is spincoated with novolak-based photoresist containing orthoazonaphthoquinone as photosensitive material sensitive to light of 365 nanometers.

Figure 13A:
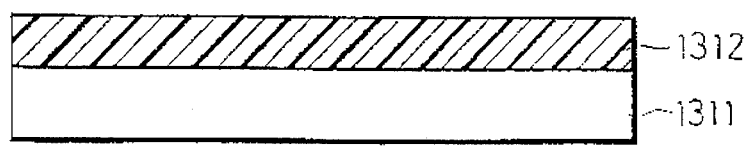
FIGS. 13A–D are sectional drawings for forming a phase shift mask having a phase difference of a 180°.

The substrate 1311 is prebaked at 90 degrees centigrade for two minutes, to form a resist film 1312 of about 1.0 micrometer in thickness as shown in FIG. 13A.

Figure 13B:
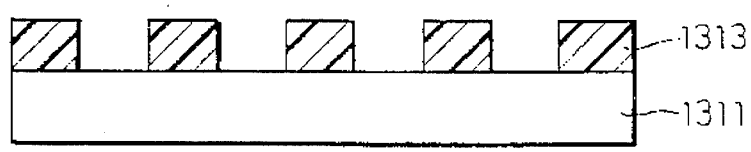

The resist film 1312 is selectively patterned with i-rays (365 nanometers) emitted from a mercury lamp and is developed with a developer containing 2.38% tetramethylammonium hydroxide (TMAH), to form the required resist pattern 1313 as shown in FIG. 13B.

Figure 13C:
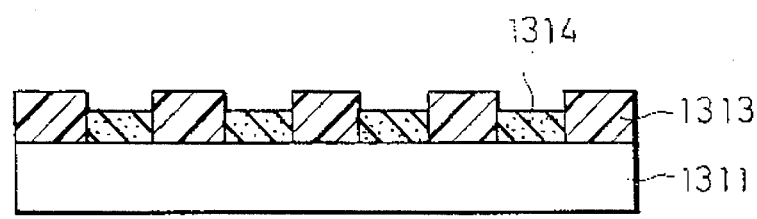
Figure 13D:
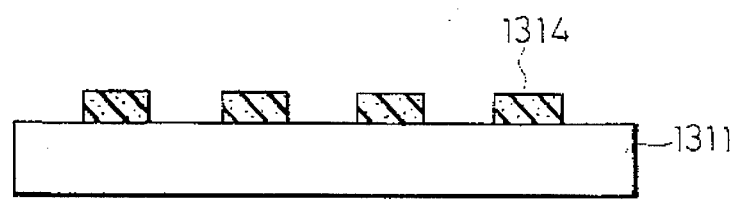

A filter to block light of 365 nanometers in wavelength, or a yellow lamp that cuts light 560 nanometers or below is employed to deposit a silicon oxide film 1314 on the substrate 1311 according to the liquid phase deposition method, as shown in FIG. 13C. Thereafter, the resist pattern 1313 is removed by an oxygen ashing method, to form a required silicon oxide pattern 1314 shown in FIG. 13D.

Figure 14:
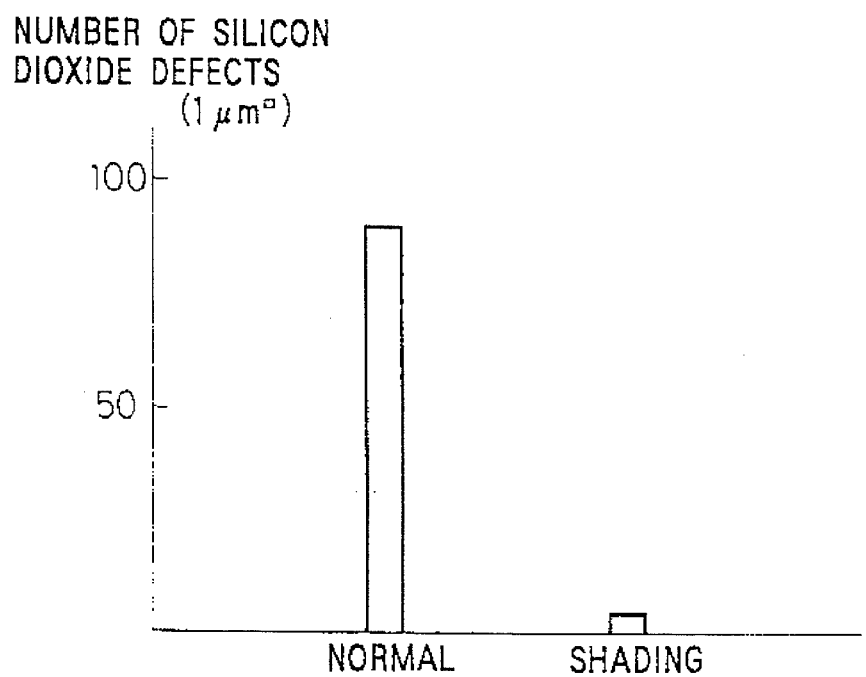
FIG. 14 illustrates a comparison between silicon oxide defects according to the present invention and the prior art.

FIG. 14 shows a comparison between the number of silicon oxide defects of this embodiment and that of the prior art employing no filter. As is apparent in the figure, this embodiment is effective to reduce silicon oxide particles growing on a resist layer.

EIGHTH EMBODIMENT

FIG. 15 shows processes of forming a mask according to the sixth aspect of the present invention. The method of this embodiment is applied to a fabrication of a Levenson type phase shift mask.

A light blocking film is formed on a mask substrate 1521 in advance. A resist pattern is formed on the light blocking film with electron beams. The resist pattern is used as a mask to etch the light blocking film into a required blocking film pattern 1522 shown in FIG. 15A. The light blocking film may be made from Cr, CrO, or MoSi and the like. The substrate 1521 is exposed to an atmosphere of hexamethyldisilazane for four minutes. The substrate 1521 is spincoated with novolak-based photoresist containing orthodiazonaphthoquinone as photosensitive material sensitive to light of 365 nanometers.

Figure 15A:
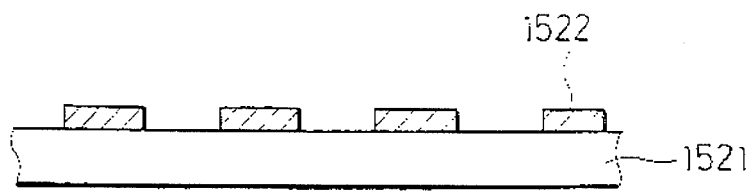
FIGS. 15A–D show processes for forming a mask according to another embodiment of the present invention.
Figure 15B:
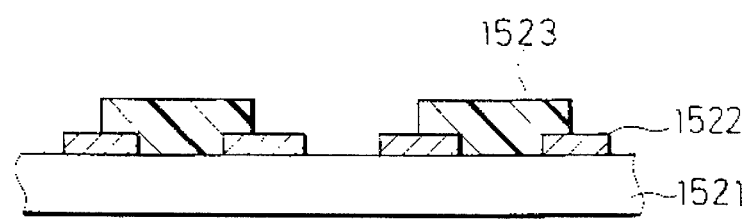
Figure 15C:
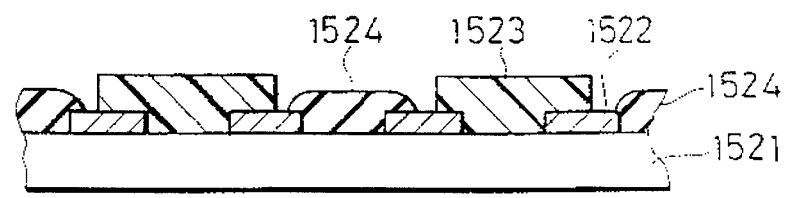

The substrate 1521 is prebaked at 90 degrees centigrade for two minutes, to form a resist layer of about 1.0 micrometer in thickness. The resist layer is patterned with i-rays (365 nanometers) emitted from a mercury lamp and is developed with a developer containing 2.38% tetramethylammonium hydroxide (TMAH), to form a required resist pattern 1523 shown in FIG. 15B. A filter to block light of 365 nanometers in wavelength, or a yellow lamp that cuts light of 560 nanometers or below is employed to selectively deposit a silicon oxide film 1524 on the substrate 1521 according to the liquid phase deposition method, as shown in FIG. 15C.

Figure 15D:
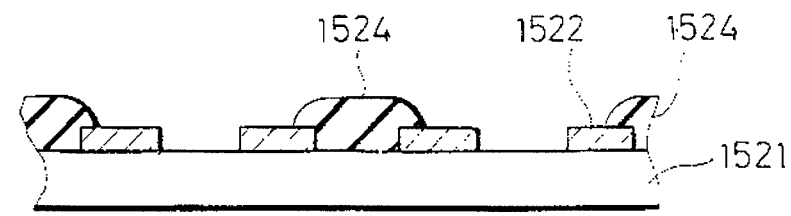

Finally, the resist pattern 1523 is removed by oxygen ashing, to form a required silicon oxide pattern 1524 shown in FIG. 15D.

Figure 16:
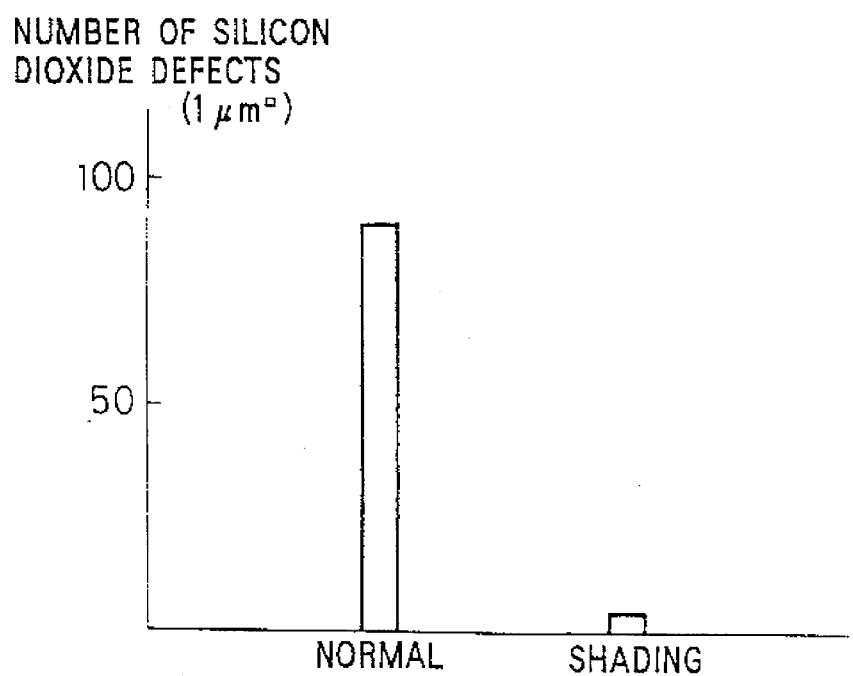
FIG. 16 shows comparison of silicon oxide defects of the embodiment of FIG. 15 and the prior art with no light blocking film.

FIG. 16 shows a comparison between the number of silicon oxide defects of this embodiment and that of the prior art employing no light blocking film. As is apparent in the figure, this embodiment is effective to reduce silicon oxide particles growing on a resist layer.

Other embodiments for reducing silicon oxide particles growing on a resist layer will be explained.

NINTH EMBODIMENT

A mask is formed with a substrate and a resist film having a predetermined thickness to cover the surface of the substrate. Firstly, the substrate is spin-coated with an Electron Beam (EB) positive type resist mainly containing poly methyl methacrylate (PMMA) and no OH radicals, COOH radicals, amine, amide, or imide. The substrate is prebaked with a hot plate at 210 degrees centigrade for 15 minutes, to form a resist layer of about 1.0 micrometer in thickness. To test the quantity of silicon oxide particles growing on the resist layer, specific processes are carried out after a patterning process were carried out without the patterning process.

Specifically, the resist layer is developed with isopropyl acetate and was rinsed with isopentyl acetate.

A silicon oxide film is deposited to a thickness of 200 nanometers on the resist layer. No silicon oxide particles were observed on the resist layer.

The following tenth embodiment according to another aspect of the present invention will be explained.

TENTH EMBODIMENT

FIGS. 17A to 17F are sectional drawings showing processes of preparing a mask according to the tenth aspect of the present invention.

A phase shift mask capable of drawing patterns only with a phase shifter having a phase difference of 180 degrees with respect to a substrate is formed.

Firstly, the mask substrate 1741 is exposed to an atmosphere of hexamethyldisilazane for four minutes. The substrate 1741 is coated with novolak-based photoresist containing orthodiazonaphthoquinone as the photosensitive material sensitive to light of 365 nanometers.

Figure 17A:
FIGS. 17A–F are sectional drawings showing preparation of a mask according to another embodiment of the present invention.

The substrate 1741 is prebaked with a hot plate at 90 degrees centigrade for two minutes, to form a resist layer 1742 of about 1.0 micrometer in thickness as shown in FIG. 17A.

Figure 17B:
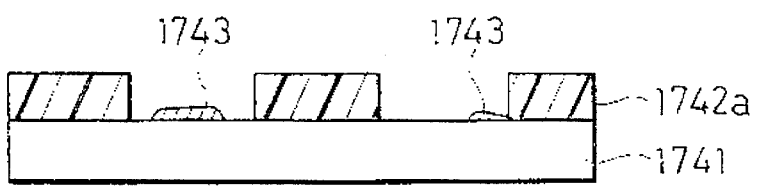

The resist layer 1742 is selectively patterned with i-rays of 365 nanometers emitted from a mercury lamp and is developed with a developer containing 2.38% tetramethylammonium hydroxide (TMAH), to form a required resist pattern 1742a shown in FIG. 17B. Some resist 1743 may be left on the substrate 1741.

Figure 17C:
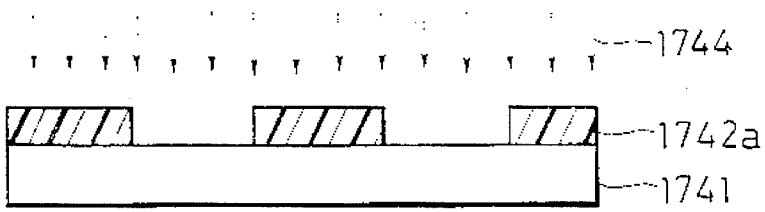
Figure 17D:
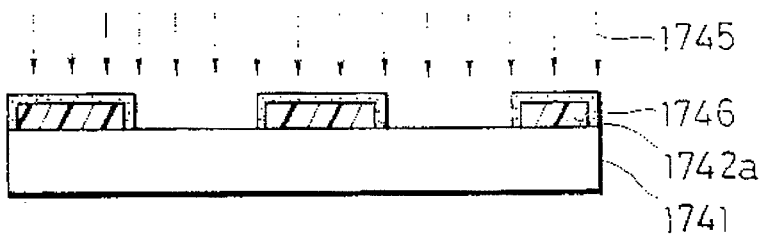

The substrate 1741 is exposed to oxygen plasma 1744 at 600 Watts with oxygen of a flow rate of 330 sccm, as shown in FIG. 17C, to remove the remnant resist 1743. The surface 1746 of the resist pattern 1742a is fluorinated with plasma 1745 containing fluorine atoms, as shown in FIG. 17D.

The plasma containing fluorine atoms may be generated by CDE (Chemical Dry Etching) with a main gas of $F_2$, $CF_4$, $CF_4/O_2$, $NF_3$, $SF_6$, $C_2F_6$.

Figure 17E:
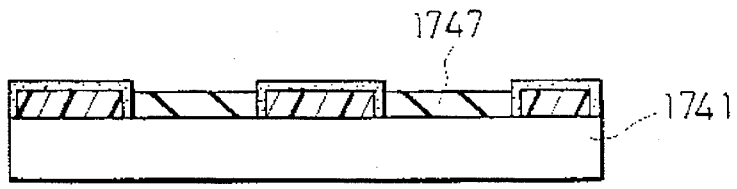
Figure 17F:
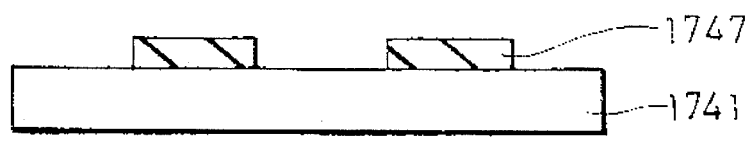

A silicon oxide pattern 1747 is formed on the substrate 1741 according to the liquid phase deposition method as shown in FIG. 17E. Finally, the resist pattern 1742a is removed, to provide a required silicon oxide pattern 1747 shown in FIG. 17F. No defects are observed on the resist pattern 1742a, which is removed by oxygen ashing.

Figure 18:
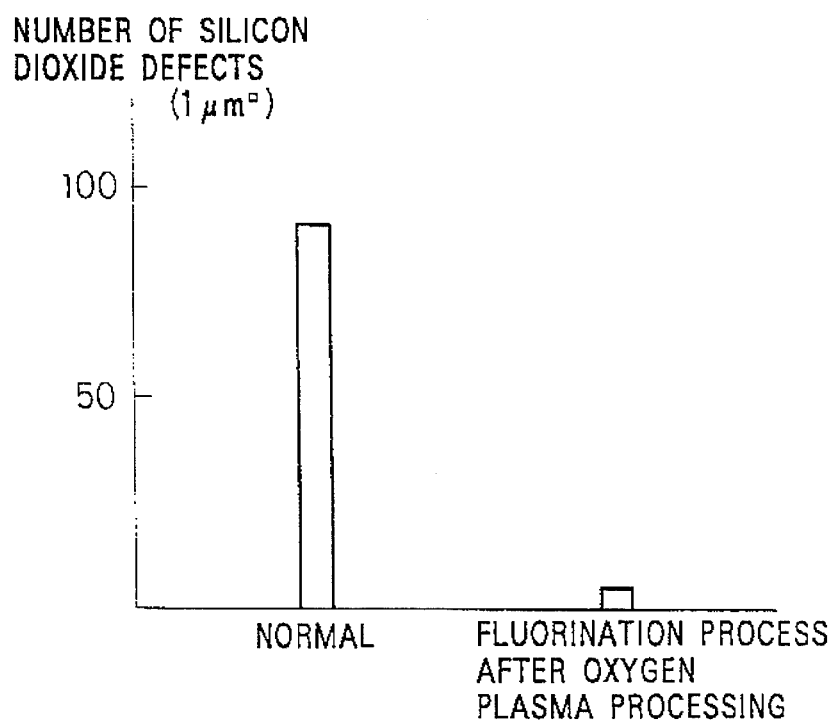
FIG. 18 compares the number of silicon oxide defects of the FIG. 17 embodiment with the prior art.

FIG. 18 shows a comparison between the number of silicon oxide defects of this embodiment and that of the prior art. As is apparent in the figure, the oxygen plasma exposing process and fluorination process are effective to reduce the silicon oxide defects.

Although this embodiment employs a mask substrate, the same effect will be achieved when forming a silicon oxide film of predetermined thickness on a silicon substrate.

ELEVENTH EMBODIMENT

This embodiment employs an $SiO_2$ substrate and prepares a mask of novolak-based photoresist in an area where no deposition is required.

Figure 19:
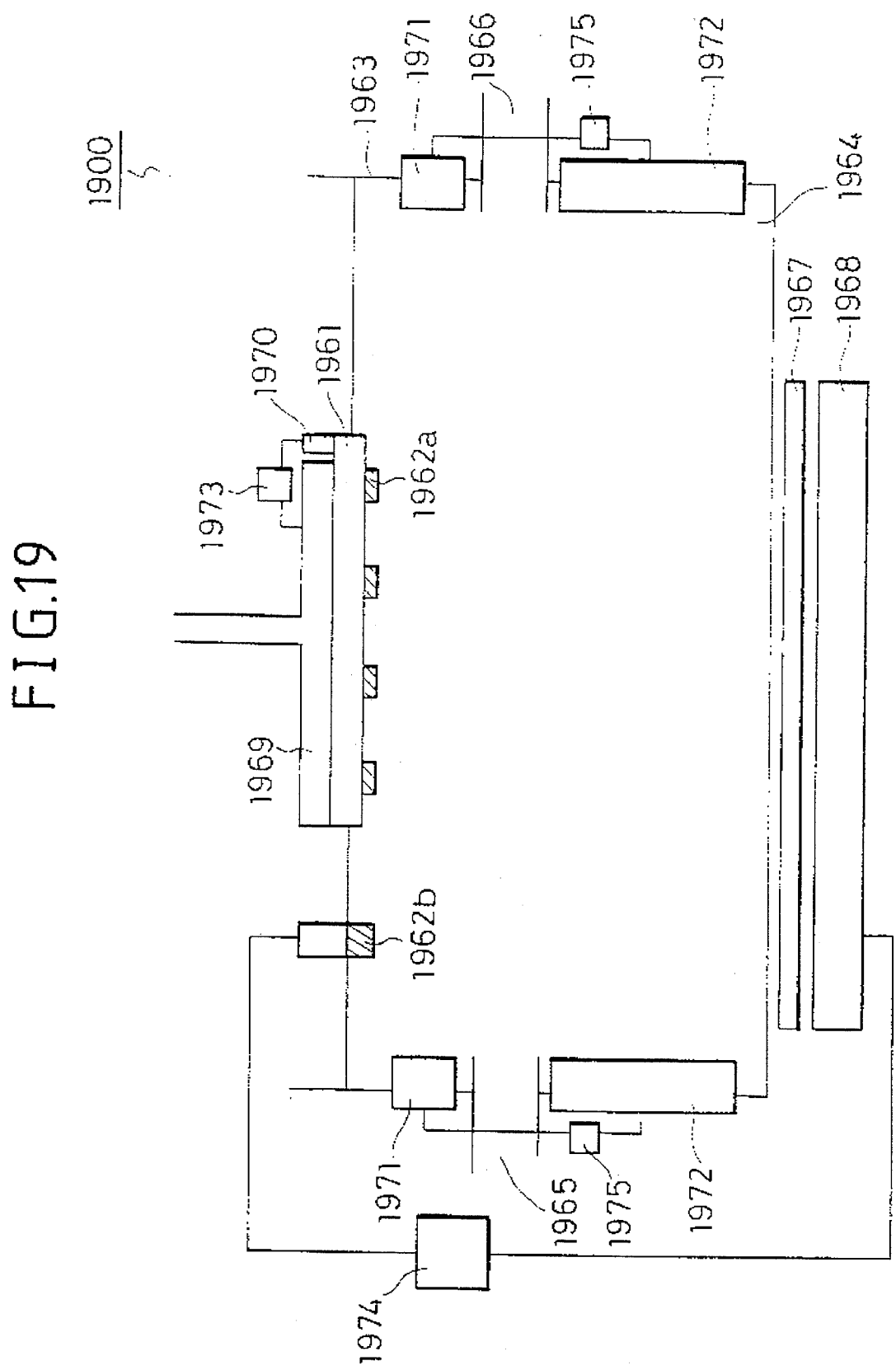
FIG. 19 shows an apparatus shows an apparatus for forming a phase shift mask capable of drawing patterns only with the phase shift according to yet another embodiment having a phase difference of 180°.

FIG. 19 shows an apparatus 1900 for forming a phase shift mask capable of drawing patterns only with a phase shifter having a phase difference of 180 degrees.

A container 1963 contains a supersaturated solution 1964, which is circulated in the container 1963 through an inlet 1965 and an outlet 1966. To deposit silicon oxide, the solution 1964 may be a supersaturated hydrofluorosilic acid solution. A transparent mask substrate 1961 having a required resist pattern 1962a is soaked in the solution 1964. The substrate 1961 is provided with a temperature adjuster 1969 and a temperature sensor 1970, to control the temperature of the substrate 1961 to a required level through a temperature controller 1973. An infrared generator 1968 is arranged under the container 1963. Infrared rays from the generator 1968 pass through a filter 1967 and are absorbed by the resist pattern 1962a.

Figure 20A:
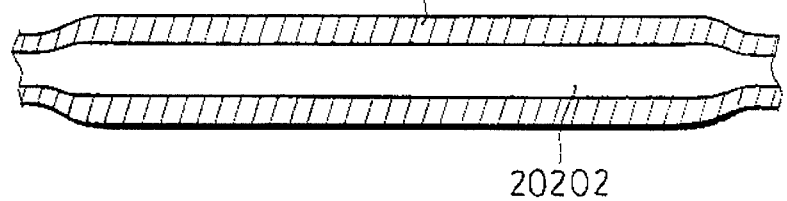
FIG. 20A shows a filter employing a silicon dioxide substrate.
Figure 20B:
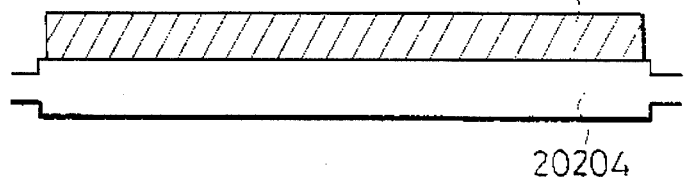
FIG. 20B shows a film made from material other than silicon dioxide which uses the same material as the substrate.

FIG. 20A shows the filter 1967. This embodiment employs the $SiO_2$ substrate on which silicon oxide deposits, so that a casing 20201 for circulating water 20202 is made from $SiO_2$. If the substrate is made from material other than $SiO_2$, a film 20203 made from the same material as the substrate is arranged in contact with water, as shown in FIG. 20B. The water is circulated and cooled, to thereby cool the film 20203.

The infrared generator 1968 may generate infrared rays of variable wavelengths. The container 1963 must not absorb the infrared rays transmitted through the filter 1967. Organic polymer 1962b similar to the resist is arranged at the same position as the resist pattern 1962a with respect to the infrared generator 1968. The polymer 1962b is provided with a temperature sensor controlled by a temperature controller 1974. The temperature controller 1974 is interlocked with the infrared generator 1968, to keep the temperature of the resist pattern 1962a higher than that of the transparent substrate 1961. The temperature of the supersaturated solution 1964 is maintained at a fixed level by temperature sensors 1971, temperature adjusters 1972, and temperature controllers 1975.

The temperature of the transparent substrate 1961 is kept lower than that of the resist pattern 1962a during deposition, to promote deposition from the supersaturated solution 1964 and improve the selectivity of the deposition.

The apparatus of FIG. 19 deposits substantially no silicon oxide in areas of the transparent substrate 1961 where no silicon oxide is required. Although this embodiment employs infrared rays, ultraviolet rays are also employable. The wavelength of the ultraviolet rays must be in a range of 200 to 250 nanometers to which the resist is insensitive. For this purpose, a mercury lamp and a narrow-band filter to transmit light around 250 nanometers may be employed.

TWELFTH EMBODIMENT

FIG. 21 shows an apparatus 2100 for forming a phase shift mask capable of drawing patterns only with a phase shifter having a phase difference of 180 degrees.

This embodiment resembles the eleventh embodiment in that it emits infrared rays to heat resist alone. An infrared generator 2188 and a filter 2187 of this embodiment, however, are arranged on the back of a transparent substrate 2161. The filter 2187 is the same as the filter 1967 of the eleventh embodiment.

The temperature of the substrate 2161 is controlled by a temperature controller 2196 and a temperature sensor 2197. Similar to the eleventh embodiment, the temperature of the substrate 2161 is set to be lower than that of a resist pattern 2162a during deposition, to promote deposition from a supersaturated solution, improve the selectivity of the deposition, and greatly reduce deposition defects.

Although this embodiment employs infrared rays, ultraviolet rays are also employable. The wavelength of the ultraviolet rays must be selected to be insensitive to the resist.

THIRTEENTH EMBODIMENT

FIG. 22 shows an apparatus 2200 for forming a phase shift mask capable of drawing patterns only with a phase shifter having a phase difference of 180 degrees.

This embodiment resembles the eleventh and twelfth embodiments. A temperature difference between resist and a substrate is controlled by temperature adjusters 22112, temperature sensors 22111, and temperature controllers 22115 arranged for a supersaturated solution, as well as a temperature adjuster 22109, a temperature sensor 22110, and a temperature controller 22113 arranged for a transparent substrate 22101.

Similar to the eleventh and twelfth embodiments, the temperature of the substrate 22101 is set to be lower than that of the resist pattern 22102a, to promote deposition from the supersaturated solution, improve the selectivity of the deposition, and greatly reduce deposition defects.

FOURTEENTH EMBODIMENT

FIGS. 23A to 23F are sectional drawings showing processes of forming a phase shift mask with no deposition layer on the back thereof according to the fourteenth aspect of the present invention.

Figure 23A:
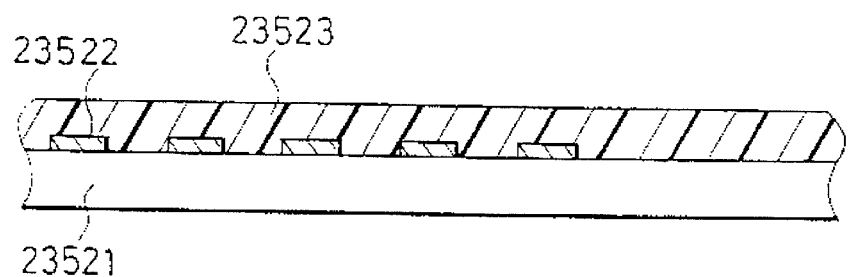
FIGS. 23A–F show sectional drawings of a phase shift mask processed with no deposition layer.
Figure 23B:
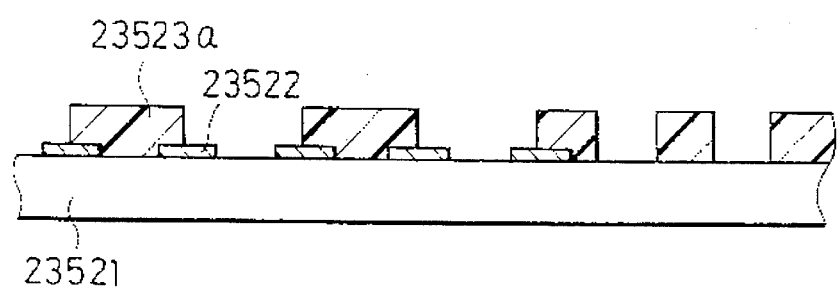

According to this embodiment, a Levenson phase shift mask pattern and a shifter edge phase shift mask pattern are formed on the same mask. A transparent quartz glass substrate 23521 and a light blocking chrome pattern 23522 are coated with a resist film 23523, as shown in FIG. 23A. The resist film 23523 is patterned into a resist pattern 23523a shown in FIG. 23B. The thickness of the resist film 23523 is about 1.0 micrometer.

Figure 23C:
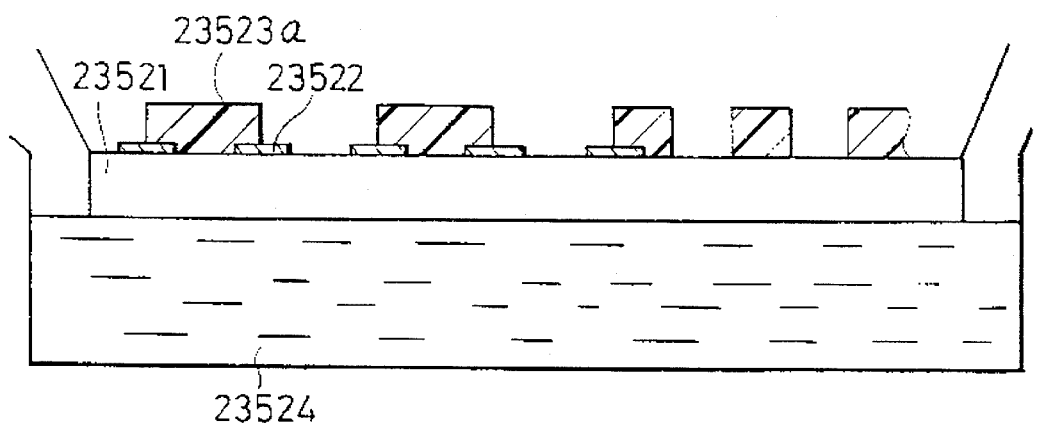
Figure 23D:
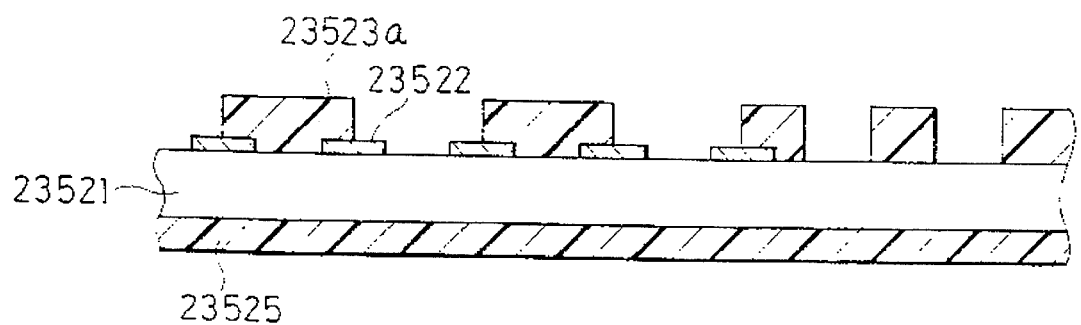

The back of the substrate 23521 where no resist exists is soaked in liquid resist in a container 23524, as shown in FIG. 23C. A resist film 23525 is formed on the back of the substrate 23521 and is dried as shown in FIG. 23D. The substrate 23521 is immersed in a solution at a room temperature according to a selective liquid phase growth method, so that a silicon oxide deposition layer 23526 is selectively formed on the substrate 23521.

Figure 23E:
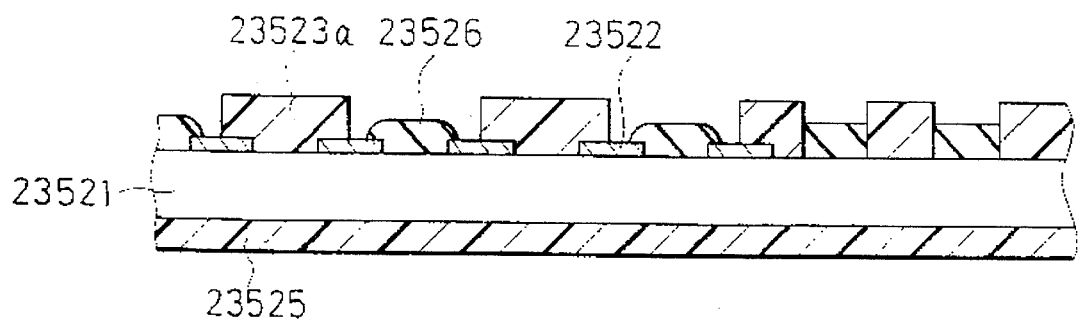

No silicon oxide deposits on the resist, to provide a structure of FIG. 23E. A soaking time is set to provide the deposition layer 23526 with a thickness of approximately $\lambda/2(n-1)$, where $\lambda$ is the wavelength of exposure light and n is a refractive index for a phase shift. The deposition layer 23526 serves as a phase shifter of the phase shift mask. The deposition layer 23526 is formed at a small deposition rate of about 100 nanometers per hour. Accordingly, it is easy to control the thickness of the layer 23526, to provide the shifter with an accurate film thickness.

Compared with other shifters made from, for example, resist, the phase shifter formed by soaking is more resistive against rinsing, etc.

Figure 23F:
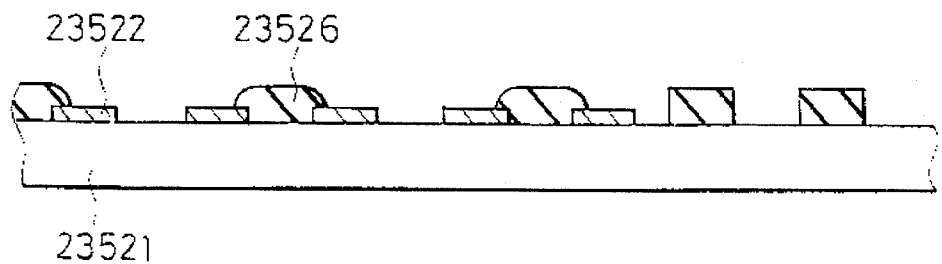

The resist pattern 23523a is removed by oxygen ashing process, to complete the phase shift mask having no deposition layer on the back thereof, as shown in FIG. 23F.

Although this embodiment forms the Levenson phase shift mask pattern and shifter edge phase shift mask pattern on the same phase shift mask, the present invention is applicable to any one of the Levenson, shifter edge, halftone, and self-alignment phase shift methods, a combination thereof, or a combination of the phase shift method and standard mask method.

FIFTEENTH EMBODIMENT

FIGS. 24A to 24E are sectional drawings showing processes of forming a phase shift mask having no deposition layer on the back thereof according to the thirteenth aspect of the present invention.

According to this embodiment, a Levenson phase shift mask pattern and a shifter edge phase shift mask pattern are formed on the same mask.

Figure 24A:
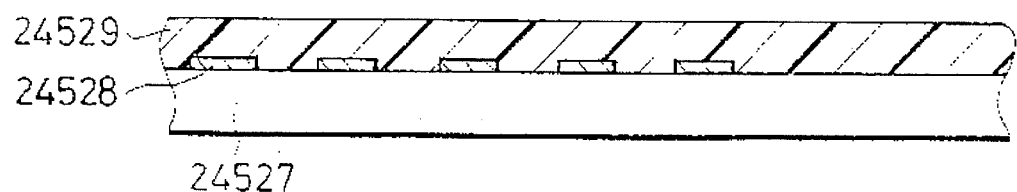
FIGS. 24A–E show sectional drawings of forming a phase shift mask having no deposition layer according to a variation of the FIG. 23.
Figure 24B:
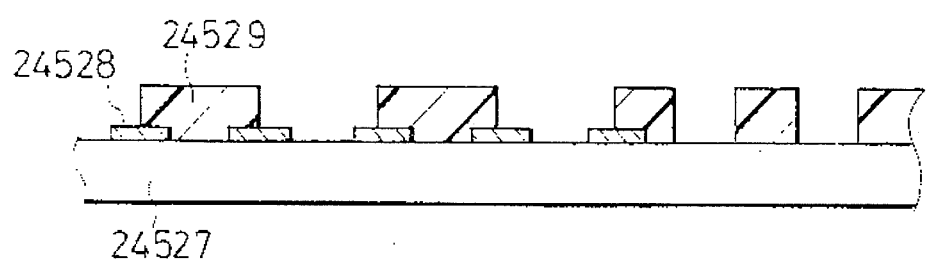

Firstly, a transparent quartz glass substrate 24527 and a light blocking chrome pattern 24528 are coated with a resist film 24529 as shown in FIG. 24A. The resist film 24529 is patterned as shown in FIG. 24B. The thickness of the resist film 24529 is about 1.0 micrometer.

Figure 24C:
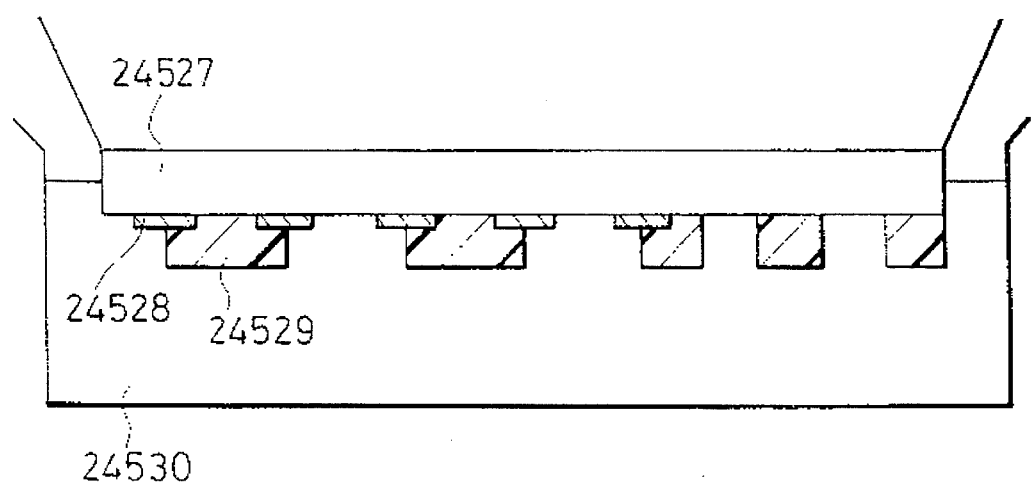
Figure 24D:
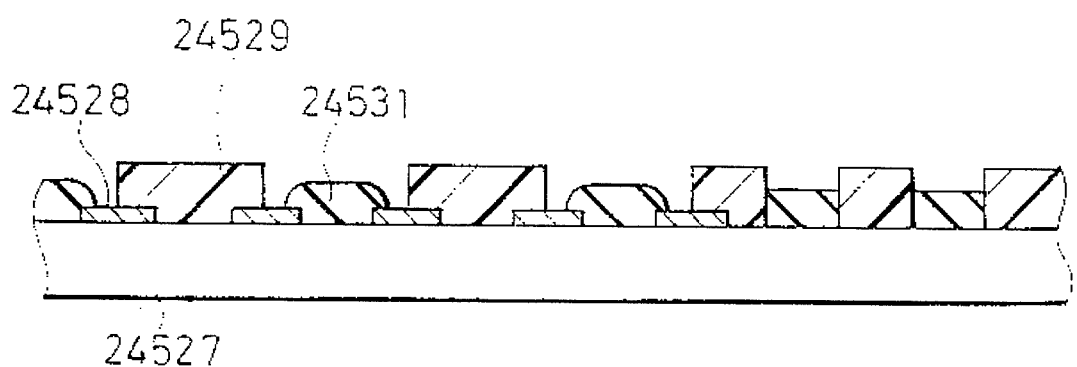

The substrate 24527 is soaked in a solution 24530 at about a room temperature according to the selective liquid deposition method. At this time, only the surface of the substrate 24527 is in the solution 24530 as shown in FIG. 24C, so that no deposition film is formed on the back of the substrate 24527. As a result, a silicon oxide deposition layer 24531 is selectively formed on the surface of the substrate 24527 with no deposition layer on the resist film 24529, as shown in FIG. 24D. A soaking time is set to provide the deposition layer 24531 with a thickness of about $\lambda/2(n-1)$, where $\lambda$ is the wavelength of exposure light and n is a refractive index for a phase shift.

The deposition layer 24531 serves as a phase shifter of the phase shifter mask. The deposition layer 24531 is formed at a small deposition rate of about 100 nanometers per hour. Accordingly, it is easy to control the thickness of the layer 24531, to provide the shifter with an accurate film thickness. Compared with other shifters made from, for example, resist, the phase shifter formed by soaking is more resistive against rinsing, etc.

Figure 24E:
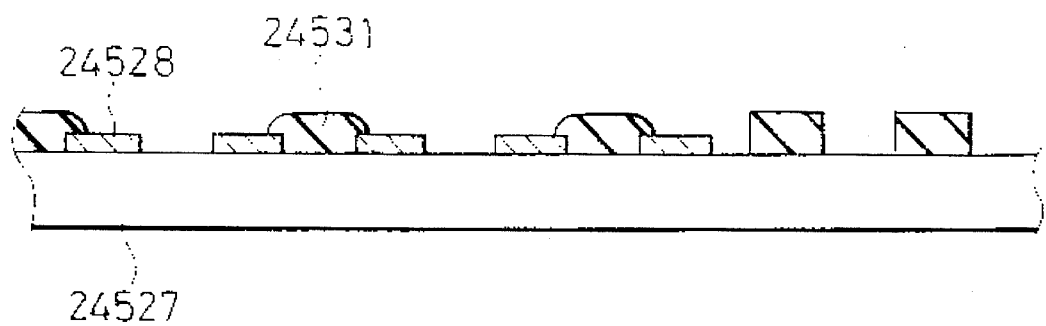

The resist 24529 is removed by oxygen ashing process, to complete the phase shift mask having no deposition layer on the back thereof, as shown in FIG. 24E.

Although this embodiment forms the Levenson phase shift mask pattern and shifter edge phase shift mask pattern on the same phase shift mask, the present invention is applicable to any one of the Levenson, shifter edge, halftone, and self-alignment phase shift methods, a combination thereof, or a combination of the phase shift method and standard mask method.

According to the present invention explained above in detail, a first film to be patterned is not necessarily a resist film but can be a film of any material if a second film is not formed on the first film. For example, an $SiO_2$ film is formed on an Al substrate, holes are formed through the $SiO_2$ film by plasma etching, a first film is formed on the substrate, and metal such as Pb is selectively deposited on the substrate only in the holes according to a liquid phase deposition method.

As explained above, the present invention selectively forms a deposition film, in particular, a silicon oxide deposition film of liquid phase. The film thus formed has a uniform thickness and substantially no defects.

The present invention provides an exposure mask having a defect free phase shift layer.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed as new and desired to be secured by Letters Patent by the U.S. is:

1. A method of manufacturing an exposure mask comprising the steps of:
   (a) forming a temporary film on a first of two opposite surfaces of a transparent substrate, said temporary film being made from a material on which silicon dioxide does not deposit by selective deposition;
   (b) forming an additional temporary film on the other of the two opposite surfaces of said transparent substrate, said additional temporary film being made from a material on which silicon dioxide does not deposit by selective deposition;
   (c) patterning the temporary film formed on the first surface of the transparent substrate in order to provide pattern openings in the temporary film;
   (d) after steps (a) and (c), immersing said transparent substrate in a solution in which silicon dioxide is dissolved;
   (e) then, initiating selective deposition of silicon dioxide on said first surface of said transparent substrate in said solution for depositing silicon dioxide within the pattern openings over the transparent substrate except for the portions of the two opposite surfaces coated with said temporary films;
   (f) finally, removing said temporary films to thereby leave a phase shifter formed from the deposition of silicon dioxide on the first surface of said transparent substrate; and
   wherein steps (d) and (e) are carried out under the condition where light of 560 nanometers or less, which is capable of exposing said temporary film, is blocked.

2. The method of manufacturing an exposure mask as claimed in claim 1, wherein said temporary film formed on the first surface of said transparent substrate is made from a photoresist material, and wherein said additional temporary film formed on the other surface of said transparent substrate is made from hydrophobic organic materials.

3. The method of manufacturing an exposure mask as claimed in claim 2, further comprising the steps of:

(g) forming a patterned shading film, having openings, on the first surface of said transparent substrate prior to step (a);
   (h) exposing said photoresist film to light in step (c), wherein said light passes from the other surface of the transparent substrate through said transparent substrate and through the openings of said patterned shading film to partially develop said photoresist film; and
   (i) removing the undeveloped portions of said photoresist film located over said patterned shading film in order to form the pattern openings through the photoresist film.

4. The method of manufacturing an exposure mask according to claim 1, wherein said temporary film formed on said first surface of said transparent substrate is a p-hydroxystyrene material.

5. A method of manufacturing an exposure mask as claimed in claim 1, wherein said temporary film is made up of photoresist containing arthoazonaphthoquinone as the photosensitive material.

6. A method of manufacturing an exposure mask as claimed in claim 1, wherein said temporary film is made up of photoresist containing arthodiazonaphthoquinone as the photosensitive material.

7. A method of manufacturing an exposure mask as claimed in claim 1, wherein said temporary film is made up of a resist mainly containing polymethylmethacrylate.

8. A method of manufacturing an exposure mask as claimed in claim 1, wherein in step (d), only one surface of said temporary film formed on said transparent substrate is soaked in the solution.

9. A method of manufacturing an exposure mask comprising the steps of:
   (a) forming a patterned shading film, having openings, on a first of two opposite surfaces of a transparent substrate;
   (b) coating a photoresist film over said patterned shading film formed on the first surface of said transparent substrate, the photoresist film being made from a material on which silicon dioxide does not deposit by selective deposition;
   (c) exposing said photoresist film to light which is passed from the other surface of the two opposite surfaces of the transparent substrate through said transparent substrate and the openings of said patterned shading film to partially develop said photoresist film;
   (d) after step (c), removing the undeveloped portion of said photoresist film located over said patterned shading film in order to form pattern openings through the photoresist film;
   (e) after step (d), immersing said transparent substrate in a solution in which silicon dioxide is dissolved;
   (f) then, initiating selective deposition of silicon dioxide on said patterned shading film within the pattern openings of the photoresist film to thereby form a phase shifter;
   (g) after step (f), removing the remaining developed portion of said photoresist film; and
   wherein steps (d) and (e) are carried out under the condition where light, which is capable of exposing said temporary film, is blocked.

10. The method of manufacturing an exposure mask as claimed in claim 9, wherein the periphery of said patterned shading film is partially removed after removal of the remaining developed portion of said photoresist film to provide phase shifting of light passing the periphery of said patterned shading film.

11. The method of manufacturing an exposure mask as claimed in claim 10, further comprising the steps of:

(h) prior to step (c), forming a temporary film on the other surface of said transparent substrate, said temporary film being made from a material on which silicon dioxide does not selectively deposit; and (i) removing said temporary film after step (g).

12. The method of manufacturing an exposure mask as claimed in claim 11, wherein said temporary film formed on the other surface of said transparent substrate is made from hydrophobic organic materials.

13. The method of manufacturing an exposure mask as claimed in claim 9, wherein said exposure of said photoresist film is terminated at a point in time such that the developed portion of said photoresist film remains separated from said shading film to form an exposed surface of said transparent substrate between said shading film and said photoresist film prior to the immersing step.

14. The method of manufacturing an exposure mask according to claim 9, wherein said photoresist film comprises a p-hydroxystyrene material.

15. A method of manufacturing an exposure mask comprising the steps of:

(a) forming a temporary film on a first of two opposite surfaces of a transparent substrate, said temporary film being made from a material on which silicon dioxide does not deposit by selective deposition;

(b) forming an additional temporary film on the other of the two opposite surfaces of said transparent substrate, said additional temporary film being made from a material on which silicon dioxide does not deposit by selective deposition;

(c) patterning the temporary film formed on the first surface of the transparent substrate in order to provide pattern openings in the temporary film;

(d) after steps (a) and (c), immersing said transparent substrate in a solution in which silicon dioxide is dissolved;

(e) then, initiating selective deposition of silicon dioxide on said first surface of said transparent substrate in said solution for depositing silicon dioxide within the pattern openings over the transparent substrate except for the portions of the two opposite surfaces coated with said temporary films;

(f) finally, removing said temporary films to thereby leave a phase shifter formed from the deposition of silicon dioxide on the first surface of said transparent substrate; and wherein said temporary film is a resist containing no OH radicals, COOH radicals, amine, amide, or imide.

16. The method of manufacturing an exposure mask as claimed in claim 15, wherein said temporary film formed on the first surface of said transparent substrate is made from a photoresist material, and wherein said additional temporary film formed on the other surface of said transparent substrate is made from hydrophobic organic materials.

17. The method of manufacturing an exposure mask as claimed in claim 16, further comprising the steps of:

(g) forming a patterned shading film, having openings, on the first surface of said transparent substrate prior to step (a);

(h) exposing said photoresist film to light in step (c), wherein said light passes from the other surface of the transparent substrate through said transparent substrate and through the openings of said patterned shading film to partially develop said photoresist film; and (i) removing the undeveloped portions of said photoresist film located over said patterned shading film in order to form the pattern openings through the photoresist film.

18. A method of manufacturing an exposure mask as claimed in claim 15, wherein said temporary film is made up of photoresist containing arthoazonaphthoquinone as the photosensitive material.

19. A method of manufacturing an exposure mask as claimed in claim 15, wherein said temporary film is made up of photoresist containing arthodiazonaphthoquinone as the photosensitive material.

20. A method of manufacturing an exposure mask as claimed in claim 15, wherein said temporary film is a resist containing no OH radicals, COOH radicals, amine, amide, or imide.

21. A method of manufacturing an exposure mask as claimed in claim 15, wherein said temporary film is made up of a resist mainly containing polymethylmethacrylate.

22. A method of manufacturing an exposure mask as claimed in claim 15, further including an additional step between step (c) and (d), wherein said temporary film is ashed in a plasma generated by a chemical dry etching with a main gas of $F_2$, $CF_4$, $CF_4/O_2$, $NF_3$, $SF_6$, $C_2F_6$ and the like.

23. A method of manufacturing an exposure mask as claimed in claim 15, wherein in steps (d) and (e), an area where said silicon dioxide is formed and another area where growth of said silicon dioxide is prevented are kept at different temperatures.

24. A method of manufacturing an exposure mask as claimed in claim 15, wherein in step (d), only one surface of said temporary film formed on said transparent substrate is soaked in the solution.

25. A method of manufacturing an exposure mask comprising the steps of:

(a) forming a patterned shading film, having openings, on a first of two opposite surfaces of a transparent substrate;

(b) coating a photoresist film over said patterned shading film formed on the first surface of said transparent substrate, the photoresist film being made from a material on which silicon dioxide does not deposit by selective deposition;

(c) exposing said photoresist film to light which is passed from the other surface of the two opposite surfaces of the transparent substrate through said transparent substrate and the openings of said patterned shading film to partially develop said photoresist film;

(d) after step (c), removing the undeveloped portion of said photoresist film located over said patterned shading film in order to form pattern openings through the photoresist film;

(e) after step (d), immersing said transparent substrate in a solution in which silicon dioxide is dissolved;

(f) then, initiating selective deposition of silicon dioxide on said patterned shading film within the pattern openings of the photoresist film to thereby form a phase shifter;

(g) after step (f), removing the remaining developed portion of said photoresist film; and wherein said temporary film is a resist containing no OH radicals, COOH radicals, amine, amide, or imide.

26. The method of manufacturing an exposure mask as claimed in claim 25, wherein the periphery of said patterned shading film is partially removed after removal of the remaining developed portion of said photoresist film to provide phase shifting of light passing the periphery of said patterned shading film.

27. The method of manufacturing an exposure mask as claimed in claim 26, further comprising the steps of:

(h) prior to step (c), forming a temporary film on the other surface of said transparent substrate, said temporary film being made from a material on which silicon dioxide does not selectively deposit; and (i) removing said temporary film after step (g).

28. The method of manufacturing an exposure mask as claimed in claim 27, wherein said temporary film formed on the other surface of said transparent substrate is made from hydrophobic organic materials.

29. The method of manufacturing an exposure mask as claimed in claim 25, wherein said exposure of said photoresist film is terminated at a point in time such that the developed portion of said photoresist film remains separated from said shading film to form an exposed surface of said transparent substrate between said shading film and said photoresist film prior to the immersing step.

30. The method of manufacturing an exposure mask according to claim 25, wherein said photoresist film comprises a p-hydroxystyrene material.

31. A method of manufacturing an exposure mask comprising the steps of:

(a) forming a temporary film on a first of two opposite surfaces of a transparent substrate, said temporary film being made from a material on which silicon dioxide does not deposit by selective deposition;

(b) forming an additional temporary film on the other of the two opposite surfaces of said transparent substrate, said additional temporary film being made from a material on which silicon dioxide does not deposit by selective deposition;

(c) patterning the temporary film formed on the first surface of the transparent substrate in order to provide pattern openings in the temporary film;

(d) after steps (a) and (c), immersing said transparent substrate in a solution in which silicon dioxide is dissolved;

(e) then, initiating selective deposition of silicon dioxide on said first surface of said transparent substrate in said solution for depositing silicon dioxide within the pattern openings over the transparent substrate except for the portions of the two opposite surfaces coated with said temporary films;

(f) finally, removing said temporary films to thereby leave a phase shifter formed from the deposition of silicon dioxide on the first surface of said transparent substrate; and (g) an additional step between step (c) and (d), wherein said temporary film is ashed in a plasma generated by a chemical dry etching with a main gas of $F_2$, $CF_4$, $CF_4/O_2$, $NF_3$, $SF_6$, $C_2F_6$ and the like.

32. The method of manufacturing an exposure mask as claimed in claim 31, wherein said temporary film formed on the first surface of said transparent substrate is made from a photoresist material, and wherein said additional temporary film formed on the other surface of said transparent substrate is made from hydrophobic organic materials.

33. The method of manufacturing an exposure mask as claimed in claim 32, further comprising the steps of:

(h) forming a patterned shading film, having openings, on the first surface of said transparent substrate prior to step (a);

(i) exposing said photoresist film to light in step (c), wherein said light passes from the other surface of the transparent substrate through said transparent substrate and through the openings of said patterned shading film to partially develop said photoresist film; and (j) removing the undeveloped portions of said photoresist film located over said patterned shading film in order to form the pattern openings through the photoresist film.

34. The method of manufacturing an exposure mask according to claim 31, wherein said temporary film formed on said first surface of said transparent substrate is a p-hydroxystyrene material.

35. A method of manufacturing an exposure mask as claimed in claim 31, wherein said temporary film is made up of a resist mainly containing polymethylmethacrylate.

36. A method of manufacturing an exposure mask as claimed in claim 31, wherein in steps (d) and (e), an area where said silicon dioxide is formed and another area where growth of said silicon dioxide is prevented are kept at different temperatures.

37. A method of manufacturing an exposure mask as claimed in claim 31, wherein in step (d), only one surface of said temporary film formed on said transparent substrate is soaked in the solution.

38. A method of manufacturing an exposure mask comprising the steps of:

(a) forming a patterned shading film, having openings, on a first of two opposite surfaces of a transparent substrate;

(b) coating a photoresist film over said patterned shading film formed on the first surface of said transparent substrate, the photoresist film being made from a material on which silicon dioxide does not deposit by selective deposition;

(c) exposing said photoresist film to light which is passed from the other surface of the two opposite surfaces of the transparent substrate through said transparent substrate and the openings of said patterned shading film to partially develop said photoresist film;

(d) after step (c), removing the undeveloped portion of said photoresist film located over said patterned shading film in order to form pattern openings through the photoresist film;

(e) after step (d), immersing said transparent substrate in a solution in which silicon dioxide is dissolved;

(f) then, initiating selective deposition of silicon dioxide on said patterned shading film within the pattern openings of the photoresist film to thereby form a phase shifter;

(g) after step (f), removing the remaining developed portion of said photoresist film; and (h) an additional step between step (c) and (d), wherein said temporary film is ashed in a plasma generated by a chemical dry etching with a main gas of $F_2$, $CF_4$, $CF_4/O_2$, $NF_3$, $SF_6$, $C_2F_6$ and the like.

39. The method of manufacturing an exposure mask as claimed in claim 38, wherein the periphery of said patterned shading film is partially removed after removal of the remaining developed portion of said photoresist film to provide phase shifting of light passing the periphery of said patterned shading film.

40. The method of manufacturing an exposure mask as claimed in claim 39, further comprising the steps of:

(i) prior to step (c), forming a temporary film on the other surface of said transparent substrate, said temporary film being made from a material on which silicon dioxide does not selectively deposit; and (j) removing said temporary film after step (g).

41. The method of manufacturing an exposure mask as claimed in claim 40, wherein said temporary film formed on the other surface of said transparent substrate is made from hydrophobic organic materials.

42. The method of manufacturing an exposure mask as claimed in claim 38, wherein said exposure of said photoresist film is terminated at a point in time such that the developed portion of said photoresist film remains separated from said shading film to form an exposed surface of said transparent substrate between said shading film and said photoresist film prior to the immersing step.

43. The method of manufacturing an exposure mask according to claim 38, wherein said photoresist film comprises a p-hydroxystyrene material.

44. A method of manufacturing an exposure mask comprising the steps of:

(a) forming a temporary film on a first of two opposite surfaces of a transparent substrate, said temporary film being made from a material on which silicon dioxide does not deposit by selective deposition;

(b) forming an additional temporary film on the other of the two opposite surfaces of said transparent substrate, said additional temporary film being made from a material on which silicon dioxide does not deposit by selective deposition;

(c) patterning the temporary film formed on the first surface of the transparent substrate in order to provide pattern openings in the temporary film;

(d) after steps (a) and (c), immersing said transparent substrate in a solution in which silicon dioxide is dissolved;

(e) then, initiating selective deposition of silicon dioxide on said first surface of said transparent substrate in said solution for depositing silicon dioxide within the pattern openings over the transparent substrate except for the portions of the two opposite surfaces coated with said temporary films;

(f) finally, removing said temporary films to thereby leave a phase shifter formed from the deposition of silicon dioxide on the first surface of said transparent substrate; and (g) wherein in steps (d) and (e), an area where said silicon dioxide is formed and another area where growth of said silicon dioxide is prevented are kept at different temperatures.

45. The method of manufacturing an exposure mask as claimed in claim 44, wherein said temporary film formed on the first surface of said transparent substrate is made from a photoresist material, and wherein said additional temporary film formed on the other surface of said transparent substrate is made from hydrophobic organic materials.

46. The method of manufacturing an exposure mask as claimed in claim 45, further comprising the steps of:

(g) forming a patterned shading film, having openings, on the first surface of said transparent substrate prior to step (a);

(h) exposing said photoresist film to light in step (c), wherein said light passes from the other surface of the transparent substrate through said transparent substrate and through the openings of said patterned shading film to partially develop said photoresist film; and (i) removing the undeveloped portions of said photoresist film located over said patterned shading film in order to form the pattern openings through the photoresist film.

47. The method of manufacturing an exposure mask according to claim 44, wherein said temporary film formed on said first surface of said transparent substrate is a p-hydroxystyrene material.

48. The method of manufacturing an exposure mask as claimed in claim 44, wherein said temporary film is made up of a resist mainly containing polymethylmethacrylate.

49. A method of manufacturing an exposure mask as claimed in claim 44, wherein in step (d), only one surface of said temporary film formed on said transparent substrate is soaked in the solution.

50. A method of manufacturing an exposure mask comprising the steps of:

(a) forming a patterned shading film, having openings, on a first of two opposite surfaces of a transparent substrate;

(b) coating a photoresist film over said patterned shading film formed on the first surface of said transparent substrate, the photoresist film being made from a material on which silicon dioxide does not deposit by selective deposition;

(c) exposing said photoresist film to light which is passed from the other surface of the two opposite surfaces of the transparent substrate through said transparent substrate and the openings of said patterned shading film to partially develop said photoresist film;

(d) after step (c), removing the undeveloped portion of said photoresist film located over said patterned shading film in order to form pattern openings through the photoresist film;

(e) after step (d), immersing said transparent substrate in a solution in which silicon dioxide is dissolved;

(f) then, initiating selective deposition of silicon dioxide on said patterned shading film within the pattern openings of the photoresist film to thereby form a phase shifter;

(g) after step (f), removing the remaining developed portion of said photoresist film; and wherein in steps (d) and (e), an area where said silicon dioxide is formed and another area where growth of said silicon dioxide is prevented are kept at different temperatures.

51. The method of manufacturing an exposure mask as claimed in claim 50, wherein the periphery of said patterned shading film is partially removed after removal of the remaining developed portion of said photoresist film to provide phase shifting of light passing the periphery of said patterned shading film.

52. The method of manufacturing an exposure mask as claimed in claim 51, further comprising the steps of:

(h) prior to step (c), forming a temporary film on the other surface of said transparent substrate, said temporary film being made from a material on which silicon dioxide does not selectively deposit; and (i) removing said temporary film after step (g).

53. The method of manufacturing an exposure mask as claimed in claim 52, wherein said temporary film formed on the other surface of said transparent substrate is made from hydrophobic organic materials.

54. The method of manufacturing an exposure mask as claimed in claim 50, wherein said exposure of said photoresist film is terminated at a point in time such that the developed portion of said photoresist film remains separated from said shading film to form an exposed surface of said transparent substrate between said shading film and said photoresist film prior to the immersing step.

55. The method of manufacturing an exposure mask according to claim 50, wherein said photoresist film comprises a p-hydroxystyrene material.

* * * * *

UNITED STATES PATENT AND TRADEMARK OFFICE
CERTIFICATE OF CORRECTION

PATENT NO. : 5,543,252
DATED : August 6, 1996
INVENTOR(S) : Tsuyoshi SHIBATA, et al.

It is certified that error appears in the above-indentified patent and that said Letters Patent is hereby corrected as shown below:

On the title page, in Item [75], the third inventor's name should read:

-- [75] Katsuhiko Hieda. --

Signed and Sealed this

Twenty-sixth Day of November 1996

Attest:

BRUCE LEHMAN

*Attesting Officer*    *Commissioner of Patents and Trademarks*